(12) United States Patent
Fanjat et al.

(10) Patent No.: US 8,235,580 B2
(45) Date of Patent: Aug. 7, 2012

(54) RECLAIM FUNCTION FOR SEMICONDUCTOR PROCESSING SYSTEMS

(75) Inventors: Norbert Fanjat, Menlo Park, CA (US); Karl J. Urquart, Allen, TX (US); Axel Soulet, Berkeley, CA (US); Laurent Langellier, Dallas, TX (US)

(73) Assignee: Air Liquide Electronics U.S. LP, Houston, TX (US)

( * ) Notice: Subject to any disclaimer, the term of this patent is extended or adjusted under 35 U.S.C. 154(b) by 879 days.

(21) Appl. No.: 12/323,994

(22) Filed: Nov. 26, 2008

(65) Prior Publication Data
US 2009/0141583 A1 Jun. 4, 2009

Related U.S. Application Data

(63) Continuation-in-part of application No. 11/549,091, filed on Oct. 12, 2006.

(60) Provisional application No. 60/990,527, filed on Nov. 27, 2007, provisional application No. 60/992,012, filed on Dec. 3, 2007, provisional application No. 60/992,014, filed on Dec. 3, 2007.

(51) Int. Cl.
*B01F 15/02* (2006.01)

(52) U.S. Cl. ....... 366/132; 134/10; 366/142; 366/152.1; 366/152.2; 700/265

(58) Field of Classification Search .......... 366/132, 366/136, 137, 142, 151.1, 152.1, 152.2; 700/265; 134/10
See application file for complete search history.

(56) References Cited

U.S. PATENT DOCUMENTS

| | | | | |
|---|---|---|---|---|
| 6,290,384 | B1 * | 9/2001 | Pozniak et al. | 366/136 |
| 7,344,297 | B2 * | 3/2008 | Urquhart | 366/132 |
| 2001/0047812 | A1 * | 12/2001 | Bryer et al. | 134/10 |
| 2002/0048213 | A1 * | 4/2002 | Wilmer et al. | 366/136 |
| 2004/0057334 | A1 * | 3/2004 | Wilmer et al. | 366/136 |

* cited by examiner

*Primary Examiner* — Robert B Davis
(74) *Attorney, Agent, or Firm* — Patricia E. McQueeney

(57) ABSTRACT

In one embodiment, a method of controlling fluids in a semiconductor processing system includes mixing two or more chemical compounds in a blender to produce a solution and supplying the solution to a reclaim tank, where the solution is dispense to a process station. The solution can be monitored at a location between the tank and the process station to determine whether at least one of the chemical compounds is at a predetermined concentration. Upon determining that the at least one chemical compound in the solution is at the predetermined concentration the solution is flowed to the process station. The method further includes removing at least a portion of the solution from the process station and returning the removed portion of the solution to the reclaim tank. The removed portion of the solution is monitored at a location between the process station and the reclaim tank to determine whether at least one of the chemical compounds in the removed portion of the solution is at a predetermined concentration. Upon determining that the at least one chemical compound in the removed portion of the solution is at the predetermined concentration, the removed portion of solution is flowed to the process station.

18 Claims, 22 Drawing Sheets

RECLAIM FUNCTION FOR SEMICONDUCTOR PROCESSING SYSTEMS

CROSS-REFERENCE TO RELATED APPLICATIONS

This application claims the benefit under 35 U.S.C. §119(e) to provisional application No. 60/990,527, filed Nov. 27, 2007; provisional application No. 60/992,012, filed Dec. 3, 2007; and provisional application No. 60/992,014, filed Dec. 3, 2007, the entire contents of each of these applications are incorporated herein by reference. This application also claims priority from and is a continuation-in-part of U.S. patent application Ser. No. 11/549,091, filed Oct. 12, 2006, which claims the benefit under 35 U.S.C. §119(e) to provisional application No. 60/801,913, filed May 19, 2006. The disclosures of the above-identified patent applications are incorporated herein by reference in their entireties.

BACKGROUND

1. Field of the Invention

This disclosure pertains to methods and systems for the management of chemicals in processing environments, such as semiconductor fabrication environments.

2. Related Art

In various industries, chemical delivery systems are used to supply chemicals to processing tools. Illustrative industries include the semiconductor industry, pharmaceutical industry, biomedical industry, food processing industry, household product industry, personal care products industry, petroleum industry and others.

The chemicals being delivered by a given chemical delivery system depend, of course, on the particular processes being performed. Accordingly, the particular chemicals supplied to semiconductor processing tools depend on the processes being performed on wafers in the tools. Illustrative semiconductor processes include etching, cleaning, chemical mechanical polishing (CMP) and wet deposition (e.g., copper electroless, electroplating, etc.).

Commonly, two or more fluids are combined to form a desired solution for a particular process. The solution mixtures can be prepared off-site and then shipped to an end point location or a point-of-use for a given process. This approach is typically referred to as batch processing or batching. Alternatively, and more desirably, the cleaning solution mixtures are prepared at the point-of-use with a suitable mixer or blender system prior to delivery to the cleaning process. The latter approach is sometimes referred as continuous blending.

In either case, accurate mixing of reagents at desired ratios is particularly important because variations in concentration of the chemicals detrimentally affect process performance. For example, failure to maintain specified concentrations of chemicals for an etch process can introduce uncertainty in etch rates and, hence, is a source of process variation.

Therefore, there is a need for methods and systems for managing chemical conditioning and supply in processing environments.

SUMMARY

In one embodiment, a method of controlling fluids in a processing system includes mixing two or more chemical compounds in a blender to produce a solution and supplying the solution to a reclaim tank, where the solution is dispense to a process station. The solution can be monitored at a location between the tank and the process station to determine whether at least one of the chemical compounds is at a predetermined concentration. Upon determining that the at least one chemical compound in the solution is at the predetermined concentration the solution is flowed to the process station. The method further includes removing at least a portion of the solution from the process station and returning the removed portion of the solution to the reclaim tank. The removed portion of the solution is monitored at a location between the process station and the reclaim tank to determine whether at least one of the chemical compounds in the removed portion of the solution is at a predetermined concentration. Upon determining that the at least one chemical compound in the removed portion of the solution is at the predetermined concentration, the removed portion of solution is flowed to the process station.

In another embodiment, a method of controlling fluids in a processing system includes mixing a solution from a supply line and a solution from a reclaim line in a reclaim tank and dispensing the mixed solution to a process station. A characteristic of the mixed solution is measured at a location between the tank and the process station to determine a concentration of a chemical compound of the mixed solution. The concentration is then compared to a predetermined target concentration. Upon determining that the chemical compound in the mixed solution is at the predetermined concentration, the mixed solution is flowed to the process station. The method also includes removing at least a portion of the mixed solution from the process station via the reclaim line and measuring a characteristic of the removed portion of the mixed solution at a location in the reclaim line to determine a concentration of a chemical compound of removed portion of the mixed solution. The concentration of the chemical compound is compared to a predetermined target concentration. Upon determining that the chemical compound in the removed portion of the solution is at the predetermined concentration, the removed portion of solution is flowed to the reclaim tank.

In yet another embodiment, a system includes a chemical blender for mixing chemical compounds to produce a solution; a reclaim tank for mixing the solution from the chemical blender and a reclaimed solution from a process station; and a dispense system for dispensing a mixed solution to the process station. The system also includes a first chemical monitor configured to monitor the mixed solution downstream from the dispense system and to determine whether at least one of the chemical compounds is at a predetermined concentration; a controller configured to flow the mixed solution to the process station upon determining that the at least one chemical compound in the mixed solution is at the predetermined concentration as determined by the first chemical monitor; and a reclamation line in fluid communication with an outlet of the process station and coupled to the reclaim tank, whereby at least a portion of mixed solution removed from the process chamber after use is reclaimed and returned to the reclaim tank. The system may further include a second chemical monitor configured to monitor the reclaimed portion of the mixed solution to determine whether the at least one of the chemical compound in the reclaimed portion is at a predetermined concentration before being reintroduced to the reclaim tank.

In yet another embodiment, the system includes a first chemical blender for mixing chemical compounds to produce a first solution and a second chemical blender for mixing chemical compounds to produce a second solution. The system also includes a first reclaim tank for receiving the first solution and dispensing the first solution and a second reclaim tank for receiving the second solution and dispensing the second solution. The system further includes a first processing station of a semiconductor processing tool having a first processing chamber in fluid communication with the first reclaim tank to receive the first solution and a second processing chamber in fluid communication with the second reclaim tank to receive the second solution and a second processing station of the semiconductor processing tool having a first processing chamber in fluid communication with the first reclaim tank to receive the first solution and a second processing chamber in fluid communication with the second reclaim tank to receive the second solution. The system still further includes a first reclamation line in fluid communication with the first processing chambers of the first and second processing stations to receive a used portion of the first solution from the first processing chambers, wherein the first reclamation line is coupled to the first reclamation tank and a second reclamation line in fluid communication with the second processing chambers of the first and second processing stations to receive a used portion of the second solution from the second processing chambers, wherein the second reclamation line is coupled to the second reclamation tank. The system still further includes a first chemical monitoring and control system configured to monitor the used portion of the first solution in the first reclamation line and determine whether a chemical compound in the used portion of the first solution is at a predetermined concentration before being returned to the first reclaim tank and a second chemical monitoring and control system configured to monitor the used portion of the second solution in the second reclamation line and determine whether a chemical compound in the used portion of the second solution is at a predetermined concentration before being returned to the second reclaim tank.

In one embodiment, a fluid is dispensed to a semiconductor processing tool for use in a manufacturing process. After the process, at least portion of the fluid is recovered and at least one metrology parameter of the fluid is measured. The fluid may then be sent to a reclaim system where it may be recycled or mixed with more fluid. Fluid may be withdrawn from the reclaim system and sent to a dispensing system, which will dispense fluid to the semiconductor processing tool. At least one metrology parameter of the fluid may be measured between the reclaim system and the dispensing system. Depending on the value of any metrology parameter, at least part of the fluid may be diverted to a drain and/or a parameter of the supply fluid can be adjusted to compensate for changes in the fluid as indicated by the measured metrology parameter.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
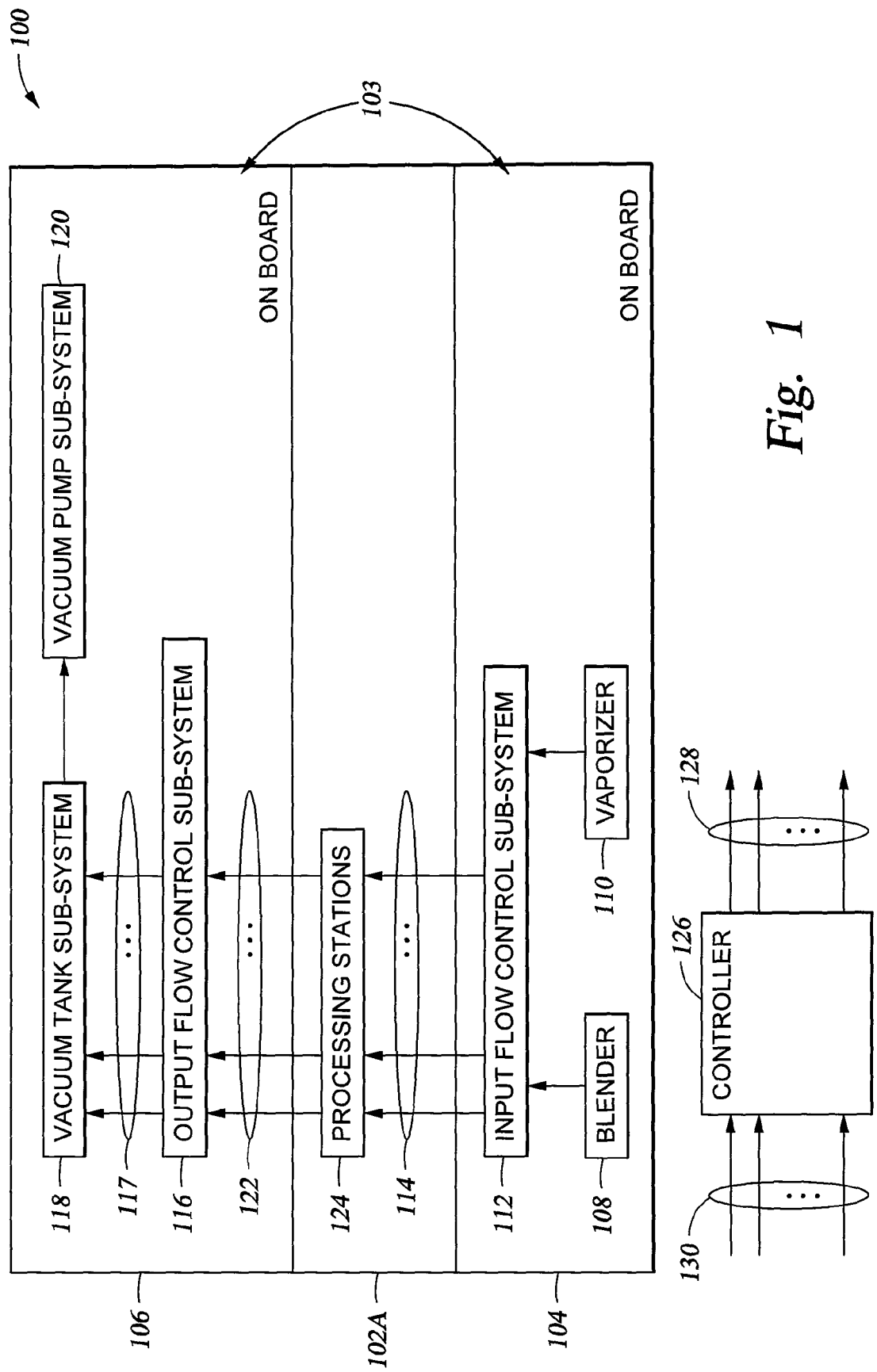
FIG. 1 is a diagram of a processing system illustrating onboard components, according to one embodiment of the present invention.

Embodiments of the present invention provide methods and chemical management systems for controlling various aspects of fluid delivery and/or recovery.
Systems Overview FIG. 1 shows one embodiment of a processing system 100. Generally, the system 100 includes a processing chamber 102 and a chemical management system 103. According to one embodiment, the chemical management system 103 includes an input subsystem 104 and an output subsystem 106. It is contemplated that any number of the components of the subsystems 104, 106 may be located onboard or off-board, relative to the chamber 102. In this context, "onboard" refers to the subsystem (or component thereof) being integrated with the chamber 102 in the Fab (clean room environment), or more generally with a processing tool of which the chamber 102 is a part; while "off-board" refers to the subsystem (or component thereof) being separate from, and located some distance away from, the chamber 102 (or tool, generally). In the case of the system 100 shown in FIG. 1, the subsystems 104, 106 are both onboard, such that the system 100 forms an integrated system which may be completely disposed in a Fab. Accordingly, the chamber 102 and the subsystems 104, 106 may be mounted to a common frame. To facilitate cleaning, maintenance and system modifications the subsystems may be disposed on detachable subframes supported by, for example, casters so that the subsystems may be easily disconnected and rolled away from the chamber 102.

Illustratively, the input subsystem 104 includes a blender 108 and a vaporizer 110 fluidly connected to an input flow control system 112. In general, the blender 108 is configured to mix two or more chemical compounds (fluids) to form a desired chemical solution, which is then provided to the input flow control system 112. The vaporizer 110 is configured to vaporize a fluid and provide the vaporized fluid to the input flow control system 112. For example, the vaporizer 110 may vaporize isopropyl alcohol and then combine the vaporized fluid with a carrier gas, such as nitrogen. The input flow control system 112 is configured to dispense the chemical solution and/or vaporized fluid to the chamber 102 at desired flow rates. To this end, the input flow control system 112 is coupled to the chamber 102A by a plurality of input lines 114. In one embodiment, the chamber 102A is configured with a single processing station 124 at which one or more processes can be performed on a wafer located at the station 124. Accordingly, the plurality of input lines 114 provide the appropriate chemistry (provided by the blender 108 via the input flow control system 112) required for performing a given process at the station 124. In one embodiment, the station 124 may be a bath, i.e., a vessel containing a chemical solution in which a wafer is immersed for a period of time and then removed. However, more generally, the station 124 may be any environment in which one or more surfaces of a wafer are exposed to one or more fluids provided by the plurality of input lines 114. Further, it is understood that while FIG. 1 shows a single processing station, the chamber 102A may include any number of processing stations, as will be described in more detail below with respect to FIG. 2.

Illustratively, the output subsystem 106 includes an output flow control system 116, a vacuum tanks subsystem 118 and a vacuum pumps subsystem 120. A plurality of output lines 122 fluidly couple the chamber 102A to the output flow control system 116. In this way, fluids are removed from the chamber 102A via the plurality of output lines 122. The removed fluids may then be sent to drain, or to the vacuum tanks subsystem 118 via fluid lines 117. In one embodiment, some fluids are removed from the vacuum tanks subsystem 118 and routed to the vacuum pump subsystem 120 for conditioning (e.g., neutralization or dilution) as part of a waste management process.

In one embodiment, the input subsystem 104 and the output subsystem 106 independently or cooperatively effect a plurality of process control objectives. For example, solution concentration may be monitored and controlled at various stages from the blender 108 to the chamber 102A. In another embodiment, the output flow control system 116, the vacuum tanks subsystem 118 and/or the vacuum pumps subsystem 120 cooperate to control a desired fluid flow over a surface of a wafer disposed in the chamber 102A. In another embodiment, the output flow control system 116 and a vacuum pumps subsystem 120 cooperate to condition fluids removed from the chamber 102A by the output flow control system 116 and then return the conditioned fluids to the blender 108. These and other embodiments are described in more detail below.

In one embodiment, transfer means (e.g., robots) are disposed inside and/or proximate the chamber 102A to move wafers into, through and out of the chamber 102. The chamber 102A may also be part of a larger tool, as will be described below.

In one embodiment, the various controllable elements of the system 100 are manipulated by a controller 126. The controller 126 may be any suitable device capable of issuing control signals 128 to one or more controllable elements of the system 100. The controller 126 may also receive a plurality of input signals 130, which may include concentration measurements of solution in the system at different locations, level sensor outputs, temperature sensor outputs, flow meter outputs, etc. Illustratively, the controller 126 may be a microprocessor-based controller for a programmable logic controller (PLC) program to implement various process controls including, in one embodiment, a proportional-integral-derivative (PID) feedback control. An exemplary controller that is suitable for use in the process control blender system is a PLC Simatic S7-300 system commercially available from Siemens Corporation (Georgia). Although the controller 126 is shown as a singular component, it is understood that the controller 126 may in fact be a plurality of control units collectively forming the control system for the processing system 100.

Figure 2:
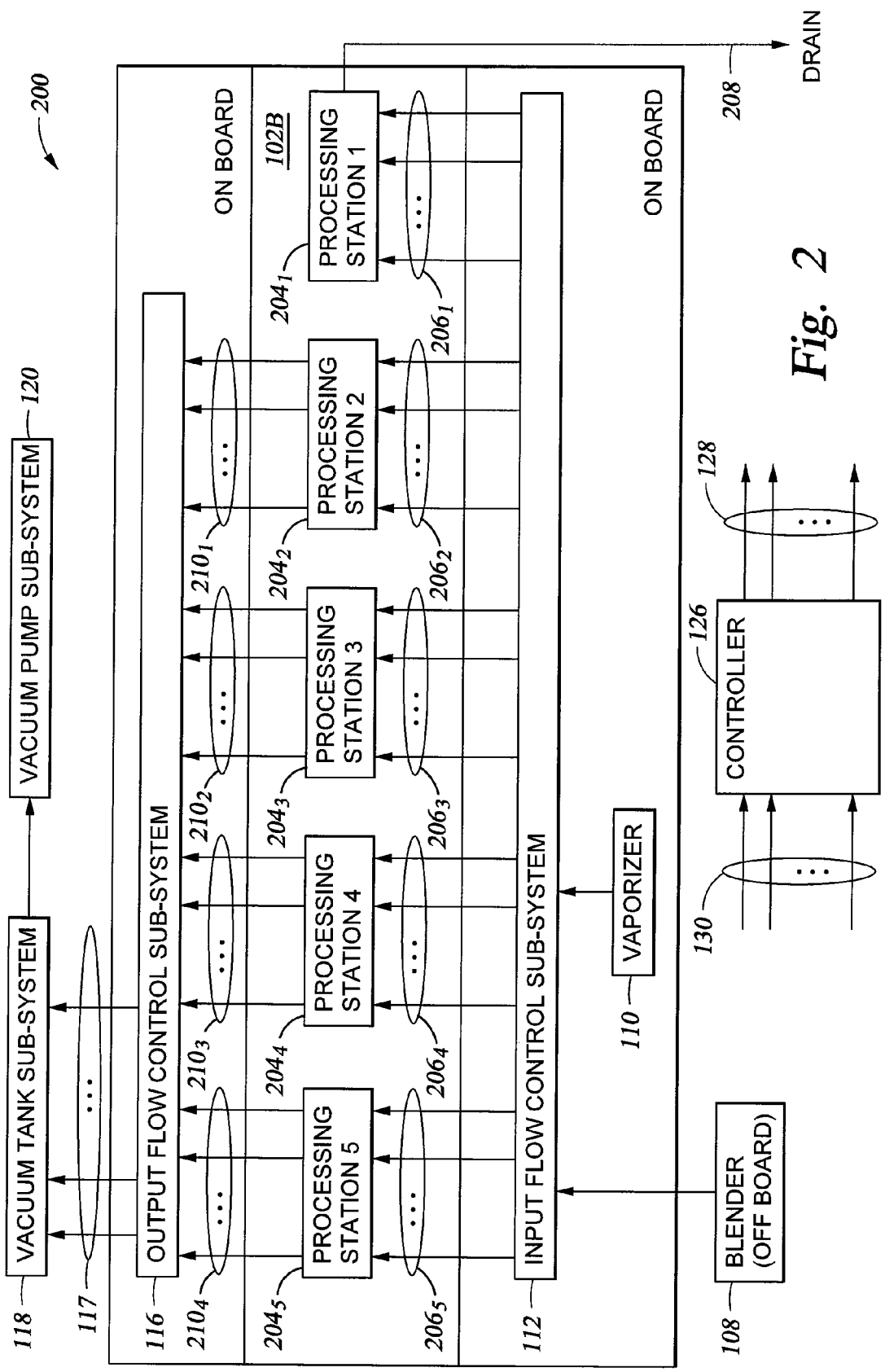
FIG. 2 is a diagram of a processing system illustrating onboard and off-board components, according to another embodiment of the present invention.

As noted above, one or more of the components of the system 100 may be located off-board relative to the chamber 102A (or the overall tool of which the chamber 102A is a part). FIG. 2 shows one such configuration of a processing system 200 having off-board components relative to a chamber 102B. Like numerals refer to components previously described with respect to FIG. 1. Illustratively, the blender 108, the vacuum tanks subsystem 118 and the vacuum pumps subsystem 120 are located off-board. In contrast, the vaporizer 110, the input flow control system 112, and the output flow control system 116 are shown as onboard components, as in FIG. 1. The off-board components may be located in the Fab with the processing tool (i.e., a processing chamber 102B and any other integrated components which may form a processing tool) or in a sub-fab. It should be understood that the configuration of the system 200 in FIG. 2 is merely illustrative and other configurations are possible and contemplated. For example, the system 200 may be configured such that the vacuum tanks subsystem 118 is onboard, while the vacuum pumps subsystem 120 is off-board. Collectively, the blender 108, the vaporizer 110, the input flow control system 112, the output flow control system 116, the vacuum tanks subsystem 118 and a vacuum pumps subsystem 120 make up the chemical management system 103, according to one embodiment of the present invention. It should be noted, however, that the chemical management systems described with respect to FIG. 1 and FIG. 2 are merely illustrative. Other embodiments within the scope of the present invention may include more or less components and/or different arrangements of those components. For example, in one embodiment of the chemical management system the vaporizer 110 is not included.

The system 200 of FIG. 2 also illustrates an embodiment of a multi-station chamber 102B. Accordingly, FIG. 2 shows the processing chamber 102B having five stations $204_{1\text{-}5}$ (individually (collectively) referred to as station(s) 204). More generally, however, the chamber 102B may have any number of stations (i.e., one or more stations). In one embodiment, the stations can be isolated from one another by sealing means (e.g., actuatable doors disposed between the processing stations). In a particular embodiment, the isolation means are vacuum tight so that the processing stations may be kept at different pressure levels.

Each station 204 may be configured to perform a particular process on a wafer. The process performed at each station may be different and, therefore, require different chemistry provided by the blender 108 via the input flow control system 112. Accordingly, the system 200 includes a plurality of input line sets $206_{1-5}$, each set corresponding to a different station. In the illustrative embodiment of FIG. 2, five sets $206_{1-5}$ of input lines are shown for each of the five processing stations. Each input line set is configured to provide an appropriate combination of chemicals to a given station. For example, in one embodiment, the chamber 102B is a cleaning module for cleaning wafers before and between, e.g., etching processes. In this case, the input line set $206_1$ for a first processing station $204_1$ may provide a combination of a SC-1 type solution (which includes a mixture of ammonium hydroxide and hydrogen peroxide in deionized water) and deionized water (DIW). The input line set $206_2$ for a second processing station $204_2$ may provide one or more of deionized water (DIW) and isopropyl alcohol (IPA). The input line set $206_3$ for a third processing station $204_3$ may provide one or more of deionized water, diluted hydrogen fluoride, and isopropyl alcohol. The input line set $206_4$ for a fourth processing station $204_4$ may provide one or more of deionized water, known mixed chemical solutions, proprietary chemical solutions of a specific nature and isopropyl alcohol. The input line set $206_5$ for a fifth processing station $204_5$ may provide one or more of deionized water, SC-2 type solution (which includes an aqueous mixture of hydrogen peroxide with hydrochloric acid) and isopropyl alcohol. As in the case of the system 100 described with respect to FIG. 1, the stations 204 may be any environment in which one or more surfaces of a wafer are exposed to one or more fluids provided by the plurality of input lines 114.

It is contemplated that fluid flow through the input lines in a given set 206 (as well as the lines 114 of FIG. 1) may be individually controlled. Accordingly, the timing and a flow rate of fluids through the individual lines of a given set may be independently controlled. Further, while some of the input lines provide fluids to a wafer surface, other fluids may be provided to the internal surfaces of a processing station 204 for the purpose of cleaning the surfaces, e.g., before or after a processing cycle. Further, the input lines shown in FIG. 2 are merely illustrative and other inputs may be provided from other sources.

Each of the processing stations $204_{1-5}$ has a corresponding output line or set of output lines, whereby fluids are removed from the respective processing stations. Illustratively, the first processing stations $204_1$ is coupled to a drain 208, while the second through the fourth processing stations $204_{2-4}$ are shown coupled to the output flow control system 116 via respective output line sets $210_{1-4}$. Each set is representative of one or more output lines. In this way, fluids are removed from the chamber 102A via the plurality of output lines 122. The fluids removed from the processing stations via the output line sets $210_{1-4}$ coupled to the output flow control system 116 may be routed to the vacuum tanks subsystem 118 via a plurality of fluid lines 117.

In one embodiment, transfer means (e.g., robots) are disposed inside and/or proximate the chamber 102B to move wafers into, through, and out of the chamber 102B. The chamber 102B may also be part of a larger tool, as will now be described below with respect to FIG. 3.

Figure 3:
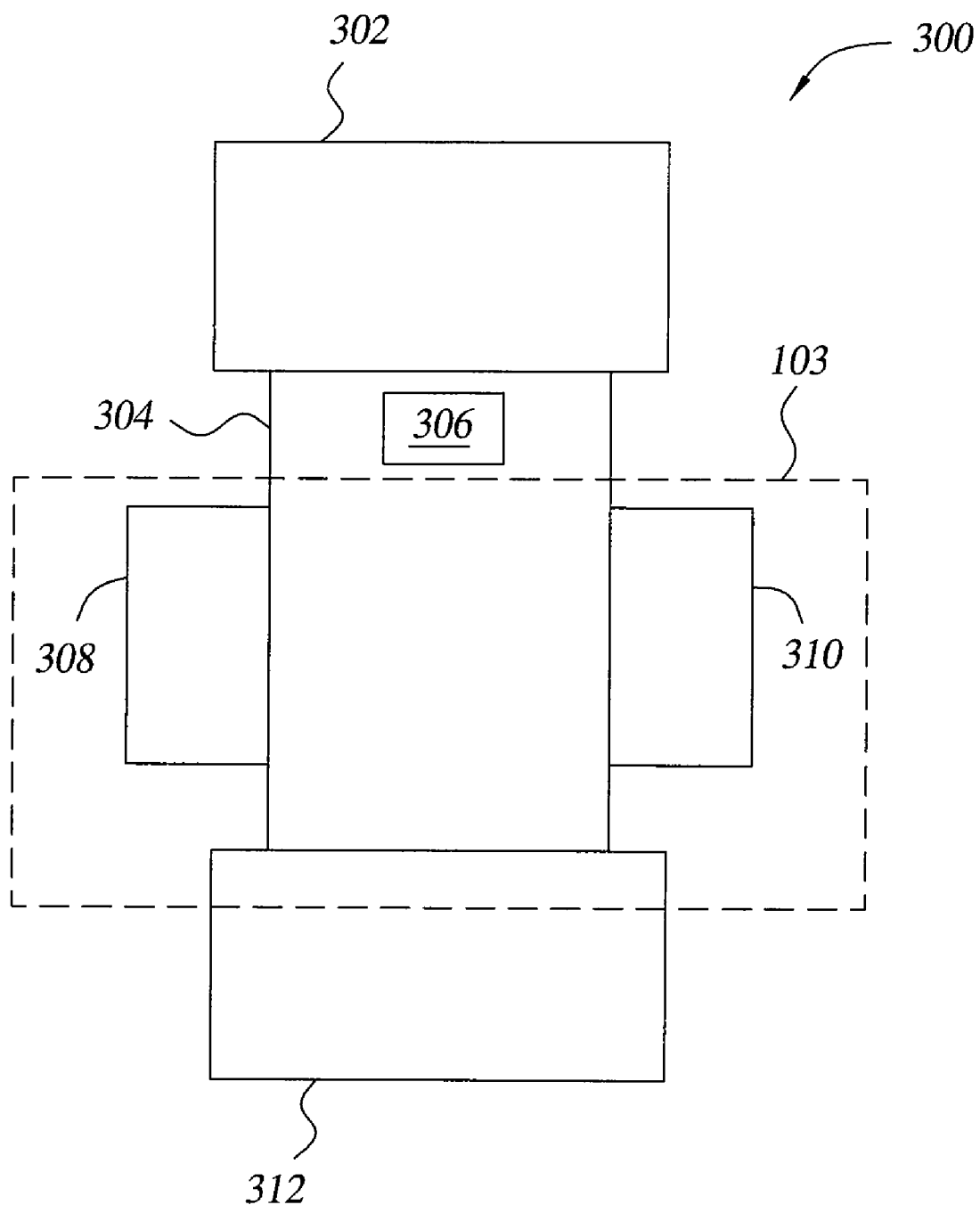
FIG. 3 is a diagram of a semiconductor fabrication system, according to one embodiment of the present invention.

Referring now to FIG. 3, a plan view of a processing system 300 is shown, according to one embodiment of the present invention. The processing system 300 includes a front end section 302 for receiving wafer cassettes. The front end section 302 interfaces with a transfer chamber 304 housing a transfer robot 306. Cleaning modules 308, 310 are disposed on either side of the transfer chamber 304. The cleaning modules 308, 310 may each include a processing chamber (single station or multi-station), such as those cleaning chambers 102A-B described above with respect to FIG. 1 and FIG. 2. The cleaning modules 308, 310 include and/or are coupled to the various components of the chemical management system 103 described above. (The chemical management system 103 is shown in dashed lines to represent the fact that some components of the chemical management system may be located onboard the processing system 300 and other components may be located off-board; or all components can be located onboard.) Opposite the front end section 302, the transfer chamber 304 is coupled to a processing tool 312.

In one embodiment, the front and section 302 may include load lock chambers which can be brought to a suitably low transfer pressure and then opened to the transfer chamber 304. The transfer robot 306 then withdraws individual wafers from the wafer cassettes located in the load lock chambers and transfers the wafers either to the processing tool 312 or to one of the cleaning modules 308, 310. During operation of the system 300, the chemical management system 103 controls the supply and removal of fluids to/from the cleaning modules 308, 310.

It is understood that the system 300 is merely one embodiment of a processing system having the chemical management system of the present invention. Accordingly, embodiments of the chemical management system are not limited to configurations such as that shown in FIG. 3, or even to semiconductor fabrication environments.

Systems and Process Control

Figure 4A:
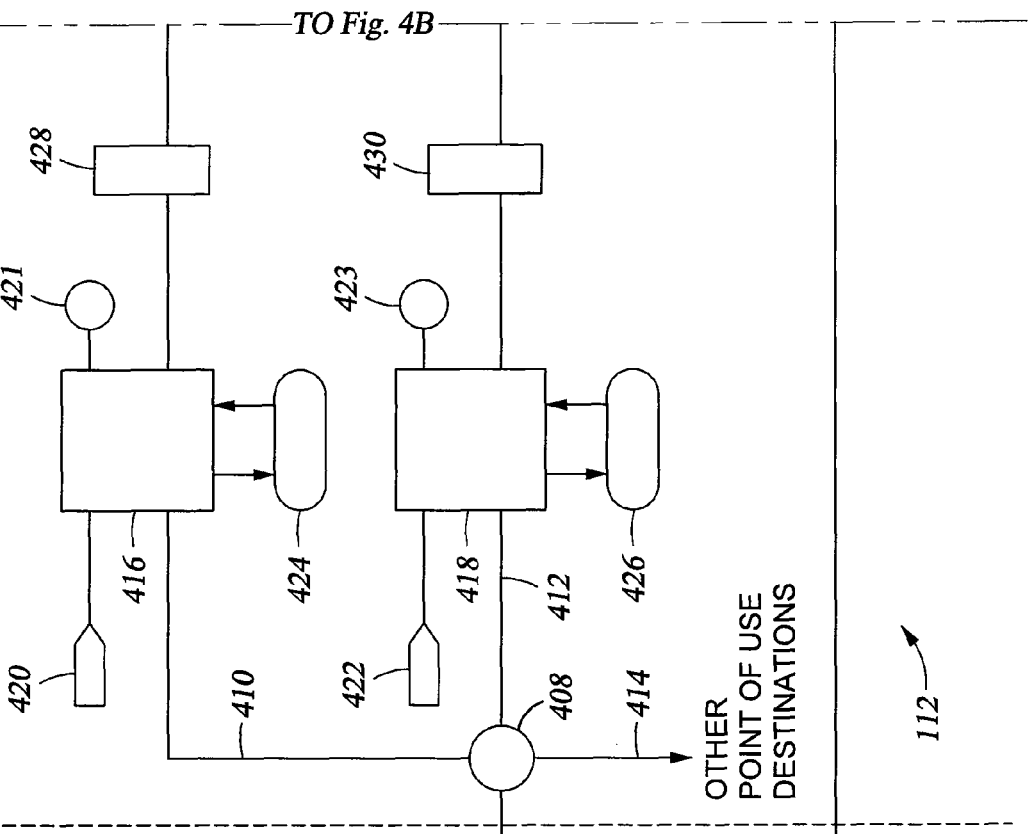
FIGS. 4A and 4B (collectively "FIG. 4") are a diagram of a processing system, according to one embodiment of the present invention.
Figure 4A:
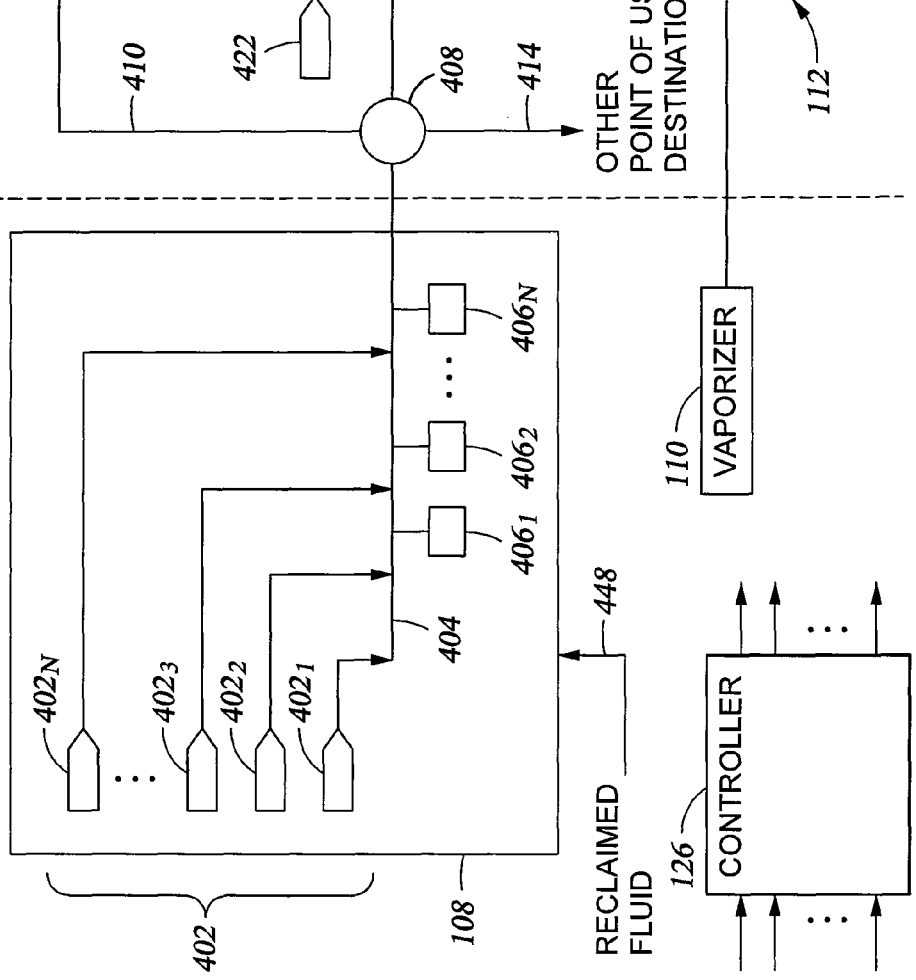
Figure 4B:
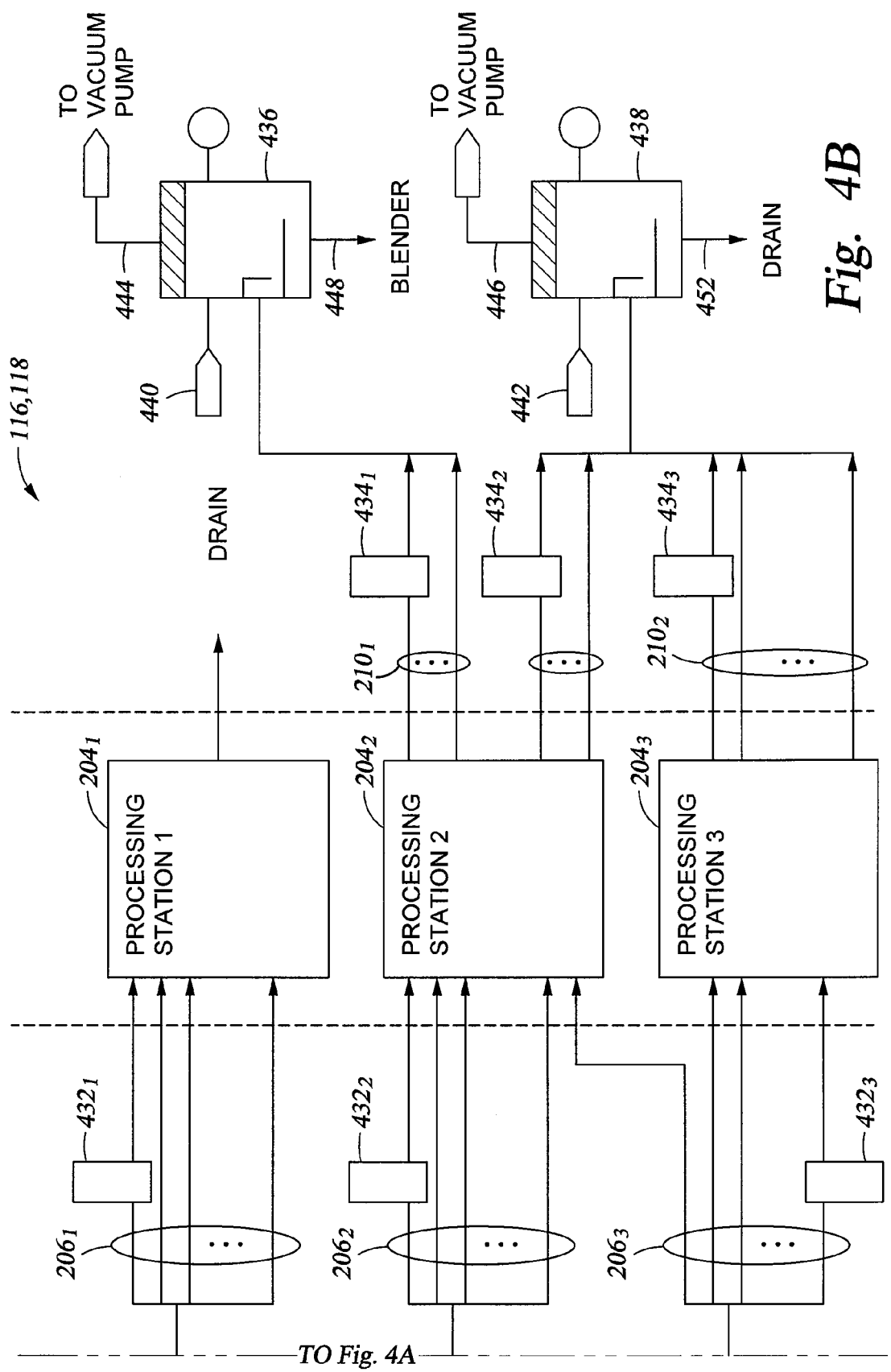

Referring now to FIG. 4, a processing system 400 is shown with respect to which additional embodiments of a chemical management system will now be described. For convenience, the additional embodiments will be described with respect to a multi-station chamber system, such as the system 200 shown in FIG. 2 and described above. It is understood, however, that the following embodiments also apply to the system 100 shown in FIG. 1. Further, it is noted that the order of the processing stations 204 in FIG. 4 is not necessarily reflective of the order in which processing is performed on a given wafer, but rather is arranged for convenience of illustration. For convenience, like reference numbers correspond to like components previously described with respect to FIGS. 1 and/or 2 and will not be described in detail again.

The blender 108 of the system 400 is configured with a plurality of inputs $402_{1-N}$ (collectively inputs 402) each receiving a respective chemical. The inputs 402 are fluidly coupled to a primary supply line 404, wherein the respective chemicals are mixed to form a solution. In one embodiment, the concentrations of the various chemicals are monitored at one or more stages along the supply line 404. Accordingly, FIG. 4 shows a plurality of chemical monitors $406_{1-3}$ (three shown by way of illustration) disposed in-line along the supply line 404. In one embodiment, a chemical monitor is provided at each point in the supply line 404 where two or more chemicals are combined and mixed. For example, a first chemical monitor $406_1$ is disposed between a point where the first and second chemicals (inputs $402_{1-2}$) are mixed and a point (i.e., upstream from) where a third chemical (input $402_3$) is introduced into the supply line 404. In one embodiment, the concentration monitors 406 used in the system are electrode-less conductivity probes and/or Refraction Index (RI) detectors including, without limitation, AC toroidal coil sensors such as the types commercially available under the model 3700 series from GLI International, Inc. (Colorado), RI detectors such as the types commercially available under the model CR-288 from Swagelok Company (Ohio), and acoustic signature sensors such as the types commercially available from Mesa Laboratories, Inc. (Colorado).

The blender 108 is selectively fluidly coupled via the primary supply line 404 to a plurality of point of use destinations (i.e., processing stations 204). (Of course, it is contemplated that in another embodiment the blender 108 services only one point of use destination.) In one embodiment, the selectivity of which processing station to service is controlled by a flow control unit 408. The flow control unit 408 is representative of any number of devices suitable for controlling aspects of fluid flow between the blender and downstream destinations. For example, the flow control unit 408 may include a multi-way valve for controlling the routing of the solution from the blender 108 to a downstream destination. Illustratively, the flow control unit 408 can selectively (e.g., under the control of the controller 126) route the solution from the blender 108 to a first point of use supply line 410, a second point of use supply line 412 or a third point of use supply line 414, where each point of use supply line is associated with a different processing station. The flow control unit 408 may also include flow meters or flow controllers.

In one embodiment, a vessel is disposed in-line with respect to each of the point of use supply lines. For example, FIG. 4 shows a first vessel 416 fluidly coupled to the first point of use supply line 410, between the flow control unit 408 and the first processing station $204_1$. Similarly, a second vessel 418 is fluidly coupled to the second point of use supply line 412, between the flow control unit 408 and the second processing station $204_2$. The vessels are suitably sized to provide a sufficient volume for supplying the respective processing stations during a time when the blender 108 is servicing a different processing station (or when the blender 108 is otherwise unavailable, such as for maintenance). In a particular embodiment, the vessels have a capacity of 6 to 10 liters, or specific volumes required for given processing requirements. The fluids levels of each vessel may be determined by the provision of respective level sensors 421, 423 (e.g., high and low sensors). In one embodiment, the vessels 416, 418 are pressure vessels and, accordingly, each include a respective inlet 420, 422 for receiving a pressurizing gas. In one embodiment, the contents of the vessels 416, 418 are monitored for concentration. Accordingly, the vessels 416, 418 shown in FIG. 4 include active concentration monitoring systems 424, 426. These and other aspects of the system 400 will be described in more detail below with respect to FIGS. 5-6.

In operation, the vessels 416, 418 dispense their contents by manipulating respective flow control devices 428, 430. The flow control devices 428, 430 may be, for example, pneumatic valves under the control of the controller 126. The solution dispensed by the vessels 416, 418 is then flowed to the respective processing station 204 via the respective input lines 206. Further, the vaporized fluid from the vaporizer 110 may be flowed to one or more processing station 204. For example, in the present illustration, vaporized fluid is input to the second processing station $204_2$.

Each of the individual input lines 206 may have one or more fluid management devices $432_{1-3}$ (for convenience, each set of input lines is shown having only one associated fluid management device). The fluid management devices 432 may include, for example, filters, flow controllers, flow meters, valves, etc. In a particular embodiment, one or more of the flow management devices 432 include heaters for heating the fluids being flowed through the respective lines.

Removal of fluids from the respective processing chambers is then performed by operation of the output flow control subsystem 116. As shown in FIG. 4, each of the respective plurality of output lines 210 of the output flow control subsystem 116 includes its own associated one or more flow management devices $434_{1-3}$ (for convenience, each set of output lines is shown having only one associated fluid management device). The fluid management devices 434 may include, for example, filters, flow controllers, flow meters, valves, etc. In one embodiment, the fluid management devices may include active pressure control units. For example, a pressure control unit may be made up of a pressure transducer coupled to a flow controller. Such active pressure control units may operate to effect a desired process control with respect to wafers and the respective processing stations, such as by controlling the interface of fluid and a wafer surface. For example, it may be necessary to control the pressure in the output lines relative to the pressure and the processing stations to ensure a desired fluid/wafer interface.

In one embodiment, fluids removed by the output flow control subsystem 116 are flowed into one or more vacuum tanks of the vacuum tanks subsystem 118. Accordingly, by way of illustration, the system 400 includes two vacuum tanks. A first tank 436 is coupled to the output lines $210_1$ of the second processing chamber $204_2$. A second tank 438 is coupled to the output lines $210_3$ of the third processing chamber $204_3$. In one embodiment, a separate tank may be provided for each different chemistry input to the respective processing stations. Such an arrangement may facilitate reuse of the fluids (reclamation will be described in more detail below) or disposal of the fluids.

The fluid levels in each of the tanks 436, 438 may be monitored by one or more level sensors 437, 439 (e.g., high and low level sensors). In one embodiment, the tanks 436, 438 are selectively pressurized by the input of a pressurizing gas 440, 442 and may also be vented to depressurize the tanks. Further, each tank 436, 438 is coupled to the vacuum pump subsystem 120 by a respective vacuum line 444, 446. In this way, vapors can be removed from the respective tanks and processed at the vacuum pump subsystem 120, as will be described in more detail below. In general, the contents of the tanks may either be sent to drain or be reclaimed and returned to the blender for reuse. Accordingly, the second tank 438 is shown emptying to a drain line 452. In contrast, the first tank 436 is shown coupled to a reclamation line 448. The reclamation line 448 is fluidly coupled to the blender 108. In this way, fluids may be returned to the blender 108 from the processing station(s) and reused. The reclamation of fluids will be described in more detail below with respect to FIG. 8.

In one embodiment, fluid delivery in the system 400 is facilitated by establishing a pressure gradient. For example, with respect to the system 400 shown in FIG. 4, a decreasing pressure gradient may be established beginning with the blender 108 and ending with the processing stations 204. In one embodiment, the blender 108 and vaporizer 110 are operated at a pressure of about 2 atmospheres, the input flow control subsystem 112 is operated at about 1 atmosphere and the processing stations 204 are operated at about 400 Torr. Establishing such a pressure gradient motivates fluid flow from the blender 108 to the processing stations 204.

During operation, the vessels 416, 418 will become depleted and must be periodically refilled. According to embodiment, the management (e.g., filling, dispensation, repair and/or maintenance) of the individual vessels occurs asynchronously. That is, while a given vessel is being serviced (e.g., filled), the other vessels may continue to dispense solution. A filling cycle for a given vessel may be initiated in response to a signal from a low fluid level sensor (one or the sensors 420, 423). For example, assume that the sensor 421 of the first vessel 416 indicates a low fluid level to the controller 126. In response, the controller 126 causes the first vessel 416 to depressurize (e.g. by opening a vent) and causes the flow control unit 408 to place the first vessel 416 in fluid communication with the blender 108, while isolating the blender from the other vessels. The controller 126 then signals the blender 108 to mix and dispense the appropriate solution to the first vessel 416. Once the first vessel 416 is sufficiently filled (e.g., as indicated by a high-level fluid sensor), the controller 126 signals the blender 108 to stop dispensing solution and causes the flow control unit 408 to isolate the blender 108 from the first vessel 416. Further, the first vessel 416 may then be pressurized by injecting a pressurizing gas into the gas inlet 420. The first vessel 416 is now ready to begin dispensation of solution to the first processing station. During this filling cycle, each of the other vessels may continue to dispense solution to their respective processing stations.

In one embodiment, it is contemplated that servicing the respective vessels is based on a prioritization algorithm implemented by the controller 126. For example, the prioritization algorithm may be based on volume usage. That is, the vessel dispensing the highest volume (e.g., in a given period of time) is given highest priority, while the vessel dispensing the lowest volume is given lowest priority. In this way, the prioritization of the vessels can be ranked from highest volume dispensed to lowest volume dispensed.

Blenders

In various embodiments, the present invention provides a point-of-use process control blender system which includes at least one blender to receive and blend at least two chemical compounds together for delivery to one or more vessels or tanks including chemical baths that facilitate processing (e.g., cleaning) of semiconductor wafers or other components. The chemical solution is maintained at a selected volume and temperature within the tank or tanks, and the blender can be configured to continuously deliver chemical solution to one or more tanks or, alternatively, deliver chemical solution to the one or more tanks only as necessary (as mentioned above and described further below), so as to maintain concentrations of compounds within the tank(s) within desirable ranges.

The tank can be part of a process tool, such that the blender provides chemical solution directly to a process tool that includes a selected volume of a chemical bath. The process tool can be any conventional or other suitable tool that processes a semiconductor wafer or other component (e.g., via an etching process, a cleaning process, etc.), such as the tool 312 described above with respect to FIG. 3. Alternatively, the blender can provide chemical solution to one or more holding or storage tanks, where the storage tank or tanks then provide the chemical solution to one or more process tools.

In one embodiment, a point-of-use process control blender system is provided that is configured to increase the flow rate of chemical solution to one or more tanks when the concentration of one or more compounds within the solution falls outside of a selected target range, so as to rapidly displace undesirable chemical solution(s) from the tank(s) while supplying fresh chemical solution to the tank(s) at the desired compound concentrations.

Figure 5:
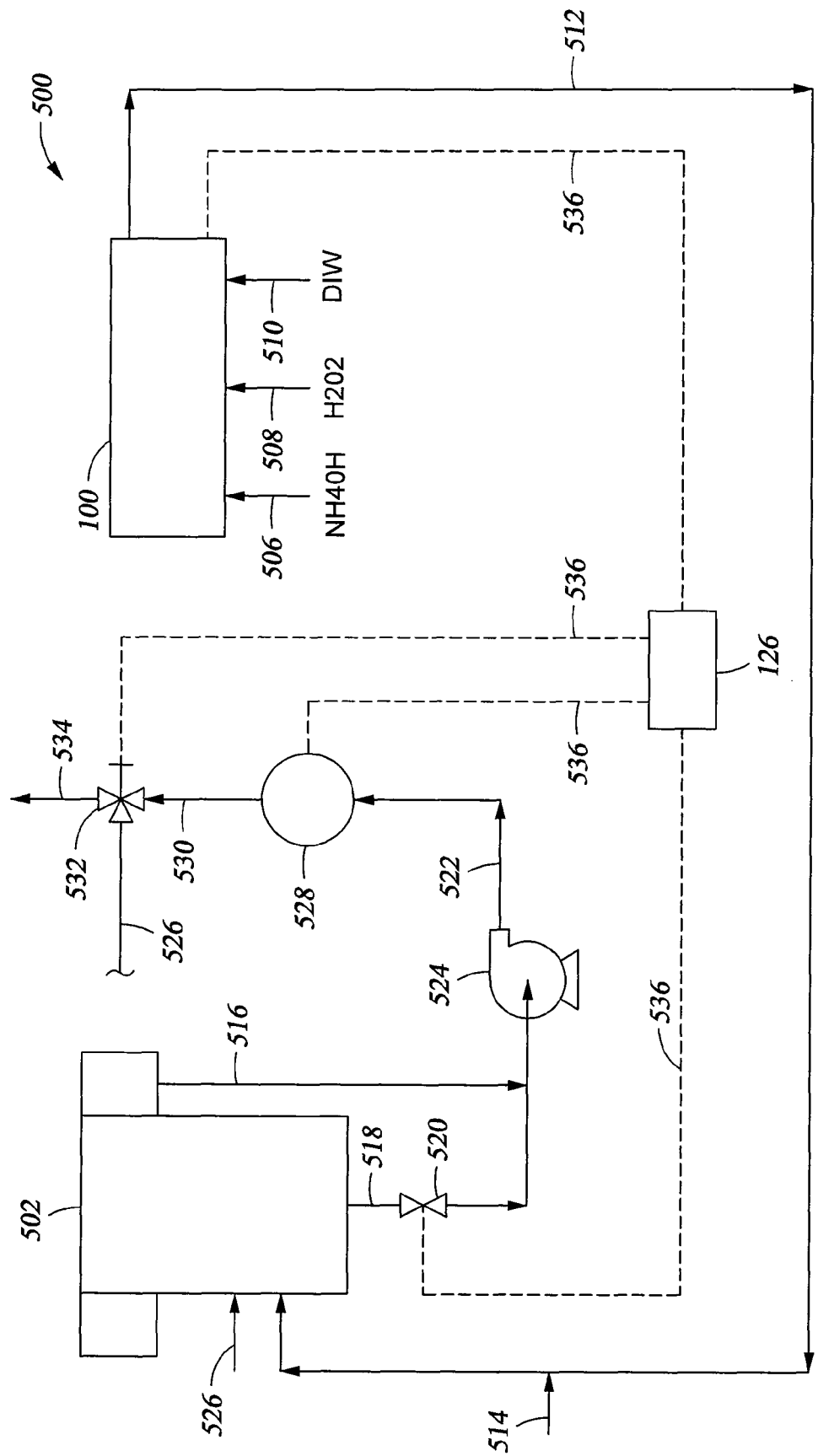
FIG. 5 is a schematic diagram of an exemplary embodiment of a semiconductor wafer cleaning system including a cleaning bath connected with a point-of-use process control blender system that prepares and delivers a cleaning solution to the cleaning bath during a cleaning process.

Referring now to FIG. 5, a blender system 500 including the blender 108 is shown, according to one embodiment of the invention. The blender 108 is shown coupled to a tank 502, and in combination with monitoring and recirculation capabilities, according to one embodiment. In one embodiment, the tank 502 is the pressure vessel 416 or 418 shown in FIG. 4. Alternatively, the tank 502 is a cleaning tank (e.g., in one of the cleaning modules 308, 310 of the processing system 400) in which semiconductor wafers or other components are immersed and cleaned.

An inlet of cleaning tank 502 is connected with the blender 108 via a flow line 512. The flow line 512 may correspond to one of the point of use lines 410, 412, 414 shown in FIG. 4, according to one embodiment. In the illustrative embodiment, the cleaning solution formed in the blender unit 108 and provided to cleaning tank 502 is an SC-1 cleaning solution, with ammonium hydroxide ($NH_4OH$) being provided to the blender unit via a supply line 506, hydrogen peroxide ($H_2O_2$) being provided to the blender unit via a supply line 508, and de-ionized water (DIW) being provided to the blender unit via a supply line 510. However, it is noted that the blender system 500 can be configured to provide a mixture of any selected number (i.e., two or more) of chemical compounds at selected concentrations to any type of tool, where the mixtures can include chemical compounds such as hydrofluoric acid (HF), ammonium fluoride ($NH_4F$), hydrochloric acid (HCl), sulfuric acid ($H_2SO_4$), acetic acid ($CH_3OOH$), ammonium hydroxide ($NH_4OH$), potassium hydroxide (KOH), ethylene diamine (EDA), hydrogen peroxide ($H_2O_2$), and nitric acid ($HNO_3$). For example, the blender 108 may be configured to dispense solutions of dilute HF, SC-1, and/or SC-2. In a particular embodiment, it may be desirable to input heated diluted HF. Accordingly, the blender 108 may be configured with an input for heated DIW. In a particular embodiment, the heated DIW may be maintained from about 25° C. to about 70° C.

In addition, any suitable surfactants and/or other chemical additives (e.g., ammonium peroxysulfate or APS) can be combined with the cleaning solutions to enhance the cleaning effect for a particular application. A flow line 514 is optionally connected with flow line 512 between the blender unit 108 and the inlet to tank 502 to facilitate the addition of such additives to the cleaning solution for use in the cleaning bath.

Tank 502 is suitably dimensioned and configured to retain a selected volume of cleaning solution within the tank (e.g., a sufficient volume to form the cleaning bath for cleaning operations). As noted above, the cleaning solution can be continuously provided from blender unit 108 to tank 502 at one or more selected flow rates. Alternatively, cleaning solution can be provided from the blender unit to the tank only at selected time periods (e.g., at initial filling of the tank, and when one or more components in the cleaning solution within the tank falls outside of a selected or target concentration range). Tank 502 is further configured with an overflow section and outlet that permits cleaning solution to exit the tank via overflow line 516 while maintaining the selected cleaning solution volume within the tank as cleaning solution is continuously fed and/or recirculated to the tank in the manner described below.

The tank is also provided with a drain outlet connected with a drain line 518, where the drain line 518 includes a valve 520 that is selectively controlled to facilitate draining and removal of cleaning solution at a faster rate from the tank during selected periods as described below. Drain valve 520 is preferably an electronic valve that is automatically controlled by a controller 126 (previously described above with respect to FIGS. 1-4). The overflow and drain lines 516 and 518 are connected to a flow line 522 including a pump 524 disposed therein to facilitate delivery of the cleaning solution removed from tank 502 to a recirculation line 526 and/or a collection site or further processing site as described below.

A concentration monitor unit 528 is disposed in flow line 522 at a location downstream from pump 524. The concentration monitor unit 528 includes at least one sensor configured to measure the concentration of one or more chemical compounds in the cleaning solution (e.g., $H_2O_2$ and/or $NH_4OH$) as the cleaning solution flows through line 522. The sensor or sensors of concentration monitor unit 528 can be of any suitable types to facilitate accurate concentration measurements of one or more chemical compounds of interest in the cleaning solution. In some embodiments, the concentration sensors used in the system are electrode-less conductivity probes and/or Refraction Index (RI) detectors including, without limitation, AC toroidal coil sensors such as the types commercially available under the model 3700 series from GLI International, Inc. (Colorado), RI detectors such as the types commercially available under the model CR-288 from Swagelok Company (Ohio), and acoustic signature sensors such as the types commercially available from Mesa Laboratories, Inc. (Colorado).

A flow line 530 connects an outlet of concentration monitor unit 528 with an inlet of a three-way valve 532. The three-way valve may be an electronic valve that is automatically controlled by controller 126 in the manner described below based upon concentration measurements provided by unit 528. A recirculation line 526 connects with an outlet of valve 532 and extends to an inlet of tank 502 to facilitate recirculation of solution from the overflow line 516 back to the tank during normal system operation (as described below). A drain line 534 extends from another outlet of valve 532 to facilitate removal of solution from tank 502 (via line 516 and/or line 522) when one or more component concentrations within the solution are outside of the target ranges.

Recirculation flow line 526 can include any suitable number and types of temperature, pressure and/or flow rate sensors and also one or more suitable heat exchangers to facilitate heating, temperature and flow rate control of the solution as it recirculates back to the tank 502. The recirculation line is useful for controlling the solution bath temperature within the tank during system operation. In addition, any suitable number of filters and/or pumps (e.g., in addition to pump 524) can be provided along flow line 526 to facilitate filtering and flow rate control of the solution being recirculated back to tank 502. In one embodiment, the recirculation loop defined by the drain line 518, the valve 520, the pump 524, the line 522, the concentration monitor unit 528, the 3-way valve 532 and the recirculation line 526 defines the one of the concentration monitoring systems 424, 426 described above with reference to FIG. 4.

The blender system 500 includes a controller 126 that automatically controls components of the blender unit 108 as well as drain valve 520 based upon concentration measurements obtained by concentration monitor unit 528. As described below, the controller controls the flow rate of cleaning solution from blender unit 108 and draining or withdrawal of cleaning solution from tank 502 depending upon the concentration of one or more compounds in the cleaning solution exiting tank 502 as measured by concentration monitor unit 528.

Controller 126 is disposed in communication (as indicated by dashed lines 536 in FIG. 5) with drain valve 520, concentration monitor unit 528, and valve 532, as well as certain components of blender unit 108 via any suitable electrical wiring or wireless communication link to facilitate control of the blender unit and drain valve based upon measured data received from the concentration monitor unit. The controller can include a processor that is programmable to implement any one or more suitable types of process control, such as proportional-integral-derivative (PID) feedback control. An exemplary controller that is suitable for use in the process control blender system is a PLC Simatic S7-300 system commercially available from Siemens Corporation (Georgia).

As noted above, the blender unit 108 receives independently fed streams of ammonium hydroxide, hydrogen peroxide and de-ionized water (DIW), which are mixed with each other at suitable concentrations and flow rates so as to obtain an SC-1 cleaning solution having a desired concentration of these compounds. The controller 126 controls the flow of each of these compounds within blender unit 108 to achieve the desired final concentration and further controls the flow rate of SC-1 cleaning solution to form the cleaning bath in tank 502.

Figure 6:
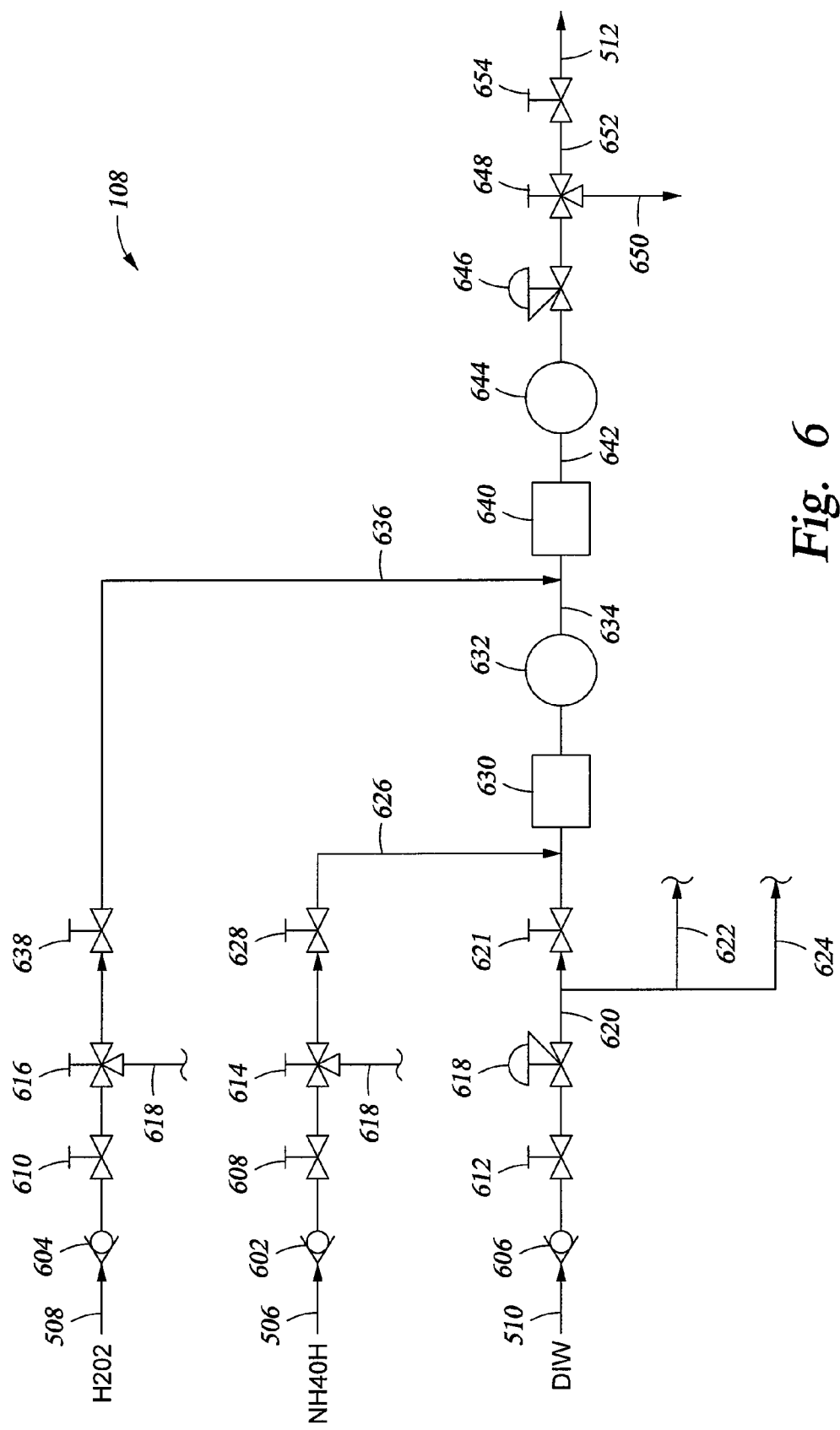
FIG. 6 is a schematic diagram of an exemplary embodiment of the process control blender system of FIG. 5.

An exemplary embodiment of the blender unit is depicted in FIG. 6. In particular, each of the supply lines 506, 508 and 510 for supplying $NH_4OH$, $H_2O_2$ and DIW to blender unit 108 includes a check valve 602, 604, 606 and an electronic valve 608, 610, 612 disposed downstream from the check valve. The electronic valve for each supply line is in communication with controller 126 (e.g., via electronic wiring or wireless link) to facilitate automatic control of the electronic valves by the controller during system operation. Each of the $NH_4OH$ and $H_2O_2$ supply lines 506 and 508 respectively connects with an electronic three-way valve 614, 616 that is in communication with controller 126 (via electronic wiring or a wireless link) and is disposed downstream from the first electronic valve 608, 610.

The DIW supply line 510 includes a pressure regulator 618 disposed downstream from electronic valve 612 to control the pressure and flow of DIW into system 108, and line 510 further branches into three flow lines downstream from regulator 618. A first branched line 620 extending from main line 510 includes a flow control valve 621 disposed along the branched line and which is optionally controlled by controller 126, and line 620 further connects with a first static mixer 630. A second branched line 622 extends from main line 510 to an inlet of the three-way valve 614 that is also connected with $NH_4OH$ flow line 506. In addition, a third branched line 624 extends from main line 510 to an inlet of the three-way valve 616 which is also connected with $H_2O_2$ flow line 508. Thus, the three-way valves for each of the $NH_4OH$ and $H_2O_2$ flow lines facilitate the addition of DIW to each of these flows to selectively adjust the concentration of ammonium hydroxide and hydrogen peroxide in distilled water during system operation and prior to mixing with each other in the static mixers of the blender unit.

An $NH_4OH$ flow line 626 is connected between an outlet of the three-way valve 614 for the ammonium hydroxide supply line and the first branch line 620 of the de-ionized water supply line at a location between valve 621 and static mixer 630. Optionally, flow line 626 can include a flow control valve 628 that can be automatically controlled by controller 126 to enhance flow control of ammonium hydroxide fed to the first static mixer. The ammonium hydroxide and de-ionized water fed to the first static mixer 630 are combined in the mixer to obtain a mixed and generally uniform solution. A flow line 634 connects with an outlet of the first static mixture and extends to and connects with a second static mixer 640. Disposed along flow line 634 is any one or more suitable concentration sensors 632 (e.g., one or more electrode-less sensors or RI detectors of any of the types described above) that determines the concentration of ammonium hydroxide in the solution. Concentration sensor 632 is in communication with controller 126 so as to provide the measured concentration of ammonium hydroxide in the solution emerging from the first static mixer. This in turn facilitates control of the concentration of ammonium hydroxide in this solution prior to delivery to the second static mixer 640 by selective and automatic manipulation of any of the valves in one or both of the NH$_4$OH and DIW supply lines by the controller.

A H$_2$O$_2$ flow line 636 connects with an outlet of the three-way valve 616 that is connected with the H$_2$O$_2$ supply line. Flow line 636 extends from three-way valve 616 to connect with flow line 634 at a location that is between concentration sensor(s) 632 and second static mixer 640. Optionally, flow line 636 can include a flow control valve 638 that can be automatically controlled by controller 126 to enhance flow control of hydrogen peroxide fed to the second static mixer. The second static mixer 640 mixes the DIW diluted NH$_4$OH solution received from the first static mixer 630 with the H$_2$O$_2$ solution flowing from the H$_2$O$_2$ feed line to form a mixed and generally uniform SC-1 cleaning solution of ammonium hydroxide, hydrogen peroxide and de-ionized water. A flow line 642 receives the mixed cleaning solution from the second static mixture and connects with an inlet of an electronic three-way valve 648.

Disposed along flow line 642, at a location upstream from valve 648, is at least one suitable concentration sensor 644 (e.g., one or more electrode-less sensors or RI detectors of any of the types described above) that determines the concentration at least one of hydrogen peroxide and ammonium hydroxide in the cleaning solution. Concentration sensor(s) 644 is also in communication with controller 126 to provide measured concentration information to the controller, which in turn facilitates control of the concentration of ammonium hydroxide and/or hydrogen peroxide in the cleaning solution by selective and automatic manipulation of any of the valves in one or more of the NH$_4$OH, H$_2$O$_2$ and DIW feed lines by the controller. Optionally, a pressure regulator 646 can be disposed along flow line 642 between sensor 644 and valve 648 so as to control the pressure and flow of cleaning solution.

A drain line 650 connects with an outlet of three-way valve 648, while flow line 652 extends from another outlet port of three-way valve 648. The three-way valve is selectively and automatically manipulated by controller 126 to facilitate control of the amount of cleaning solution that emerges from the blender unit for delivery to tank 502 and the amount that is diverted to drain line 650. In addition, an electronic valve 654 is disposed along flow line 652 and is automatically controlled by controller 126 to further control flow of cleaning solution from the blender unit to tank 502. Flow line 652 becomes flow line 512 as shown in FIG. 5 for delivery of SC-1 cleaning solution to tank 502.

The series of electronic valves and concentration sensors disposed within blender unit 108 in combination with controller 126 facilitate precise control of the flow rate of cleaning solution to the tank and also the concentrations of hydrogen peroxide and ammonium peroxide in the cleaning solution at varying flow rates of the cleaning solution during system operation. Further, the concentration monitor unit 528 disposed along the drain line 522 for tank 502 provides an indication to the controller when the concentration of one or both the hydrogen peroxide and ammonium peroxide falls outside of an acceptable range for the cleaning solution.

Based upon concentration measurements provided by concentration monitor unit 528 to controller 126, the controller may be programmed to implement a change in flow rate of cleaning solution to the tank and to open drain valve 520 so as to facilitate a rapid displacement of SC-1 cleaning solution in the bath while supplying fresh SC-1 cleaning solution to the tank, thus bringing the cleaning solution bath within compliant or target concentration ranges as quickly as possible. Once cleaning solution has been sufficiently displaced from the tank such that the hydrogen peroxide and/or ammonium hydroxide concentrations fall within acceptable ranges (as measured by concentration monitor unit 528), the controller is programmed to close drain valve 520 and to control the blender unit so as to reduce (or cease) the flow rate while maintaining the desired compound concentrations within the cleaning solution being delivered to the tank 502.

An exemplary embodiment of a method of operating the system described above and depicted in FIGS. 5 and 6 is described below. In this exemplary embodiment, cleaning solution can be continuously provided to the tank or, alternatively, provided only at selected intervals to the tank (e.g., when cleaning solution is to be displaced from the tank). An SC-1 cleaning solution is prepared in blender unit 108 and provided to tank 502 with a concentration of ammonium hydroxide in a range from about 0.01-29% by weight, preferably about 1.0% by weight, and a concentration of hydrogen peroxide in a range from about 0.01-31% by weight, preferably about 5.5% by weight. The cleaning tank 502 is configured to maintain about 30 liters of cleaning solution bath within the tank at a temperature in the range from about 25° C. to about 125° C.

In operation, upon filling the tank 502 with cleaning solution to capacity, the controller 126 controls blender unit 108 to provide cleaning solution to tank 502 via flow line 512 at a first flow rate from about 0-10 liters per minute (LPM), where the blender can provide solution continuously or, alternatively, at selected times during system operation. When the solution is provided continuously, an exemplary first flow rate is about 0.001 LPM to about 0.25 LPM, preferably about 0.2 LPM. Ammonium hydroxide supply line 506 provides a feed supply of about 29-30% by volume NH$_4$OH to the blender unit, while hydrogen peroxide supply line 508 provides a feed supply of about 30% by volume H$_2$O$_2$ to the blender unit. At a flow rate of about 0.2 LPM, the flow rates of the supply lines of the blender unit can be set as follows to ensure a cleaning solution is provided having the desired concentrations of ammonium hydroxide and hydrogen peroxide: about 0.163 LPM of DIW, about 0.006 LPM of NH$_4$OH, and about 0.031 LPM of H$_2$O$_2$.

Additives (e.g., APS) can optionally be added to the cleaning solution via supply line 514. In this stage of operation, a continuous flow of fresh SC-1 cleaning solution can be provided from the blender unit 108 to tank 502 at the first flow rate, while cleaning solution from the cleaning bath is also exiting tank 502 via overflow line 516 at generally the same flow rate (i.e., about 0.2 LPM). Thus, the volume of the cleaning solution bath is maintained relatively constant due to the same or generally similar flow rates of cleaning solution to and from the tank. The overflow cleaning solution flows into drain line 522 and through concentration monitor unit 528, where concentration measurements of one or more compounds (e.g., H$_2$O$_2$ and/or NH$_4$OH) within the cleaning solution are determined continuously or at selected time intervals, and such concentration measurements are provided to controller 126.

Cleaning solution can optionally be circulated by adjusting valve 532 such that cleaning solution flowing from tank 502 flows through recirculation line 526 and back into the tank at a selected flow rate (e.g., about 20 LPM). In such operations, blender unit 108 can be controlled such that no cleaning solution is delivered from the blender unit to the tank unless the concentrations of one or more compounds in the cleaning solution are outside of selected target ranges. Alternatively, cleaning solution can be provided by the blender unit at a selected flow rate (e.g., about 0.20 LPM) in combination with the recirculation of cleaning solution through line 526. In this alternative operating embodiment, three-way valve 532 can be adjusted (e.g., automatically by controller 126) to facilitate removal of cleaning solution into line 534 at about the same rate as cleaning solution being provided to the tank by the blender unit, while cleaning solution still flows through recirculation line 526. In a further alternative, valve 532 can be closed to prevent any recirculation of fluid through line 526 while cleaning solution is continuously provided to tank 502 by blender unit 108 (e.g., at about 0.20 LPM). In this application, solution exits the tank via line 516 at about the same or similar flow rate as the flow rate of fluid into the tank from the blender unit.

For applications in which cleaning solution is continuously provided to the tank, controller 126 maintains the flow rate of cleaning solution from blender unit 108 to tank 502 at the first flow rate, and the concentrations of hydrogen peroxide and ammonium hydroxide within the selected concentration ranges, so long as the measured concentrations provided by the concentration monitor unit 528 are within acceptable ranges. For applications in which cleaning solution is not continuously provided from the blender unit to the tank, controller 126 maintains this state of operation (i.e., no cleaning solution from blender unit to tank) until a concentration of hydrogen peroxide and/or ammonium hydroxide are outside of the selected concentration ranges.

When the concentration of at least one of hydrogen peroxide and ammonium hydroxide, as measured by concentration monitor unit 528, deviates outside of the acceptable range (e.g., the measured concentration of $NH_4OH$ deviates from the range of about 1% relative to a target concentration, and/or the measured concentration of $H_2O_2$ deviates from the range of about 1% relative to a target concentration), the controller manipulates and controls any one or more of the valves in blender unit 108 as described above to initiate or increase the flow rate of cleaning solution from the blender unit to tank 502 (while maintaining the concentrations of $NH_4OH$ and $H_2O_2$ in the cleaning solution within the selected ranges) to a second flow rate.

The second flow rate can be in a range from about 0.001 LPM to about 20 LPM. For continuous cleaning solution operations, an exemplary second flow rate is about 2.5 LPM. The controller further opens drain valve 520 in tank 502 to facilitate a flow of cleaning solution from the tank at about the same flow rate. At the flow rate of about 2.5 LPM, the flow rates of the supply lines of the blender unit can be set as follows to ensure a cleaning solution is provided having the desired concentrations of ammonium hydroxide and hydrogen peroxide: about 2.04 LPM of DIW, about 0.070 LPM of $NH_4OH$, and about 0.387 LPM of $H_2O_2$.

Alternatively, cleaning solution that is being recirculated to the tank at a selected flow rate (e.g., about 20 LPM) is removed from the system by adjusting three-way valve 532 so that cleaning fluid is diverted into line 534 and no longer flows into line 526, and the blender unit adjusts the second flow rate to a selected level (e.g., 20 LPM) so as to compensate for the removal of fluid at the same or similar flow rate. Thus, the volume of cleaning solution bath within tank 502 can be maintained relatively constant during the increase in flow rate of cleaning solution to and from the tank. In addition, the process temperature and circulation flow parameters within the tank can be maintained during the process of replacing a selected volume of the solution within the tank.

The controller maintains delivery of the cleaning solution to tank 502 at the second flow rate until concentration monitor unit 528 provides concentration measurements to the controller that are within the acceptable ranges. When the concentration measurements by concentration monitor unit 528 are within the acceptable ranges, the cleaning solution bath is again compliant with the desired cleaning compound concentrations. The controller then controls blender unit 108 to provide the cleaning solution to tank 502 at the first flow rate (or with no cleaning solution being provided to the tank from the blender unit), and the controller further manipulates drain valve 520 to a closed position so as to facilitate flow of cleaning solution from the tank only via overflow line 516. In applications in which the recirculating line is used, the controller manipulates three-way valve 532 such that cleaning solution flows from line 522 into line 526 and back into tank 502.

Thus, the point-of-use process control blender system described above is capable of effectively and precisely controlling the concentration of at least two compounds in a cleaning solution delivered to a chemical solution tank (e.g., a tool or a solution tank) during an application or process despite potential decomposition and/or other reactions that may modify the chemical solution concentration in the tank. The system is capable of continuously providing fresh chemical solution to the tank at a first flow rate, and rapidly displacing chemical solution from the tank with fresh chemical solution at a second flow rate that is faster than the first flow rate when the chemical solution within the tank is determined to have undesirable or unacceptable concentrations of one or more compounds.

The point-of-use process control blender systems are not limited to the exemplary embodiments described above and depicted in FIGS. 5 and 6. Rather, such systems can be used to provide chemical solutions with mixtures of any two or more compounds such as the types described above to any semiconductor processing tank or other selected tool, while maintaining the concentrations of compounds within the chemical solutions within acceptable ranges during cleaning applications.

In addition, the process control blender system can be implemented for use with any selected number of solution tanks or tanks and/or semiconductor process tools. For example, a controller and blender unit as described above can be implemented to supply chemical solution mixtures with precise concentrations of two or more compounds directly to two or more process tools. Alternatively, the controller and blender unit can be implemented to supply such chemical solutions to one or more holding or storage tanks, where such storage tanks supply chemical solutions to one or more process tools (such as in the system 400 shown in FIG. 4). The process control blender system provides precise control of the concentrations of compounds in the chemical solutions by monitoring the concentration of solution(s) within the tank or tanks, and replacing or replenishing solutions to such tanks when the solution concentrations fall outside of target ranges.

The design and configuration of the process control blender system facilitates placement of the system in substantially close proximity to the one or more chemical solution tanks and/or process tools which are to be provided with chemical solution from the system. In particular, the process control blender system can be situated in or near the fabrication (fab) or clean room or, alternatively, in the sub-fab room but proximate where the solution tank and/or tool is located in the clean room. For example, the process control blender system, including the blender unit and controller, can be situated within about 30 meters, preferably within about 15 meters, and more preferably within about 3 meters or less, of the solution tank or process tool. Further, the process control blender system can be integrated with one or more tools so as to form a single unit including the process blender system and tool(s).

Off-Board Blenders

As mentioned above, the blender 108 may be located off-board, according to one embodiment. That is, the blender 108 may be decoupled from the processing station(s) being serviced by the blender 108, in which case the blender 108 may then be remotely located, e.g., in a sub-fab.

Figure 7:
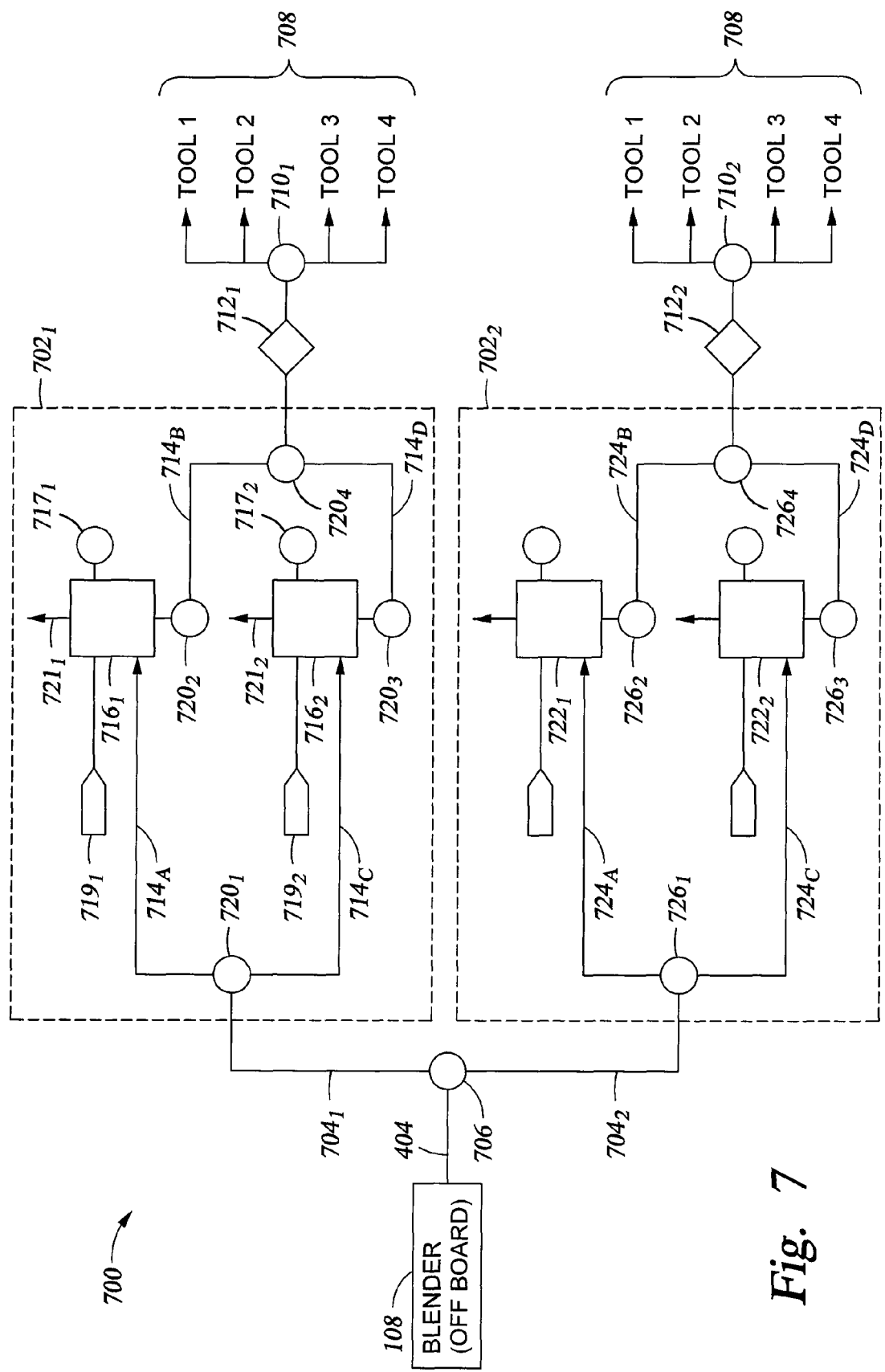
FIG. 7 is a diagram of a processing system having an off-board blender, according to one embodiment of the present invention.

In a particular embodiment of an off-board blender, a centralized blender is configured for servicing a plurality of tools. One such centralized blender system 700 is shown in FIG. 7. In general, the blender system 700 includes a blender 108 and one or more filling stations $702_{1-2}$. In the illustrative embodiment two filling stations $702_{1-2}$ (collectively filling stations 702) are shown. The blender 108 may be configured as in any of the embodiments previously described (e.g., as described above with respect to FIG. 6). The blender 108 is fluidly coupled to the filling stations 702 by a primary supply line 404 and a pair of flow lines $704_{1-2}$ coupled at their respective ends to one of the filling stations $702_{1-2}$. A flow control unit 706 is disposed at the junction of the primary supply line and the flow lines $704_{1-2}$. The flow control unit 706 is representative of any number of devices suitable for controlling aspects of fluid flow between the blender 108 and the filling stations 702. For example, the flow control unit 706 may include a multi-way valve for controlling the routing of the solution from the blender 108 to a downstream destination. Accordingly, the flow control unit 408 can selectively (e.g., under the control of the controller 126) route the solution from the blender 108 to the first filling station $702_1$ via the first flow line $704_1$ and to the second filling station $702_2$ via the second flow line $704_2$. The flow control unit 706 may also include flow meters or flow controllers.

Each of the filling stations 702 is coupled to one or more processing tools 708. In the illustrative embodiment, the filling stations are each coupled to four tools (Tools 1-4), although more generally the filling stations may be coupled to any number of points of use. Routing (and/or metering, flow rate, etc.) of the solutions from the filling stations 702 may be controlled by flow control units $710_{1-2}$ disposed between the respective filling stations and the plurality of tools 708. In one embodiment, filters $712_{1-2}$ are disposed between the respective filling stations and the plurality of tools 708. The filters $712_{1-2}$ are selected to remove debris from the solution prior to being delivered to the respective tools.

In one embodiment, each filling station 702 supplies a different chemistry to the respective tools 708. For example, in one embodiment the first filling station $702_1$ supplies diluted hydrofluoric acid, while the second filling station $702_2$ supplies a SC-1 type solution. Flow control devices at the respective tools may be operated to route the incoming solutions to appropriate processing stations/chambers of the tools.

In one embodiment, each of the filling stations may be operated asynchronously with respect to the blender 108. That is, each filling station $702_{1-2}$ may be filled while simultaneously dispensing a solution to one or more of the tools 708. To this end, each filling station is configured with a filling loop having at least two vessels disposed therein. In the illustrative embodiment, the first filling station has a first filling loop $714_{A-D}$ with two vessels $716_{1-2}$. The filling loop is defined by a plurality of flow line segments. A first flow line segment $714_A$ fluidly couples the flow line 704 with the first vessel $716_1$. A second flow line segment $714_B$ fluidly couples the first vessel $716_1$ to the processing tools 708. A third flow line segment $714_C$ fluidly couples the flow line 704 with the second vessel $716_2$. A fourth flow line segment $714_D$ fluidly couples the second vessel $716_2$ to the processing tools 708. A plurality of valves $720_{1-4}$ are disposed in the filling loop to control fluid communication between the blender 108 and the vessels 716, and between the vessels 716 and the plurality of tools 708.

Each of the vessels 716 have an appropriate number of level sensors $717_{1-2}$ (e.g., a high level sensor and a low level sensor) in order to sense a fluid level within the respective vessel. Each of the vessels also has a pressurizing gas input $719_{1-2}$, whereby the respective vessel may be pressurized, and a vent $721_{1-2}$, whereby the respective vessel may be depressurized. Although not shown, the filling loop $714_{A-D}$ of the first processing station $702_1$ may be equipped with any number of flow management devices, such as pressure regulators, flow controllers, flow meters, etc.

The second filling station 702 is likewise configured. Accordingly, the second filling station 702 of FIG. 7 is shown having two vessels $722_{1-2}$ disposed in a filling loop $724_{A-D}$ having a plurality of valves $726_{1-4}$ for controlling fluid communication.

In operation, the controller 126 may operate the flow control unit 706 to establish communication between the blender 108 and the first filling station $702_1$. The controller 126 may also operate the first filling loop valve $720_1$ to establish fluid communication between the first flow line $704_1$ and the first flow line segment $714_A$ of the filling loop $714_{A-D}$, thereby establishing fluid communication between the blender 108 and the first vessel $716_1$. In this configuration, the blender 108 may flow a solution to the first vessel $716_1$ until an appropriate one of the sensors $717_1$ (i.e., a high level sensor) indicates that the vessel is full, at which point the first filling loop valve is closed $720_1$ and the vessel $716_1$ may be pressurized by application of a gas to the pressurizing gas input $719_1$. Prior to and during filling the first vessel, the respective vent $721_1$ may be open to allow the vessel to depressurize.

While the first vessel $716_1$ is being filled, the filling station $702_1$ may be configured such that the second vessel $716_2$ is dispensing solution to one or more of the tools 708. Accordingly, the second valve $720_2$ is closed, the third valve $720_3$ is open, and the fourth valve $720_2$ is set to a position allowing fluid communication between the second vessel $716_2$ and the processing tools 708 via the fourth flow line segment $714_D$. During dispensation of solution, the second vessel may be under pressure by application of a pressurizing gas to the respective gas input $721_2$.

Upon determining that the fluid level in second vessel $716_2$ has reached a predetermined low level, as indicated by an appropriate low level sensor $717_2$, the filling station 702 may be configured to halt dispensation from the second vessel $716_2$ and begin dispensation from the first vessel $716_1$ by setting the valves of the first filling loop to appropriate positions. The second vessel $716_2$ may then be depressurized by opening the respective vent $721_2$, after which the second vessel $716_2$ may be filled by solution from the blender 108.

The operation of the second filling station $702_2$ is identical to the operation of the first filling station $702_1$ and, therefore, will not be described in detail.

After filling a vessel in one of the filling stations $702_{1-2}$, the filling station will be capable of dispensing a solution to one or more of the tools 708 for a period of time. During this time, the flow control unit 706 may be operated to place the blender 108 in fluid communication with the other filling station. It is contemplated that the vessels of the filling stations may be sized in capacity such that, for given flow rates into and out of the filling stations, the blender 108 may refill one of the vessels of one of the filling stations before the standby vessel of the other filling station is depleted. In this way, solution dispensation from the filling stations may be maintained with no interruption, or substantially no interruption.

Reclamation Systems

First Embodiment

Figure 8A:
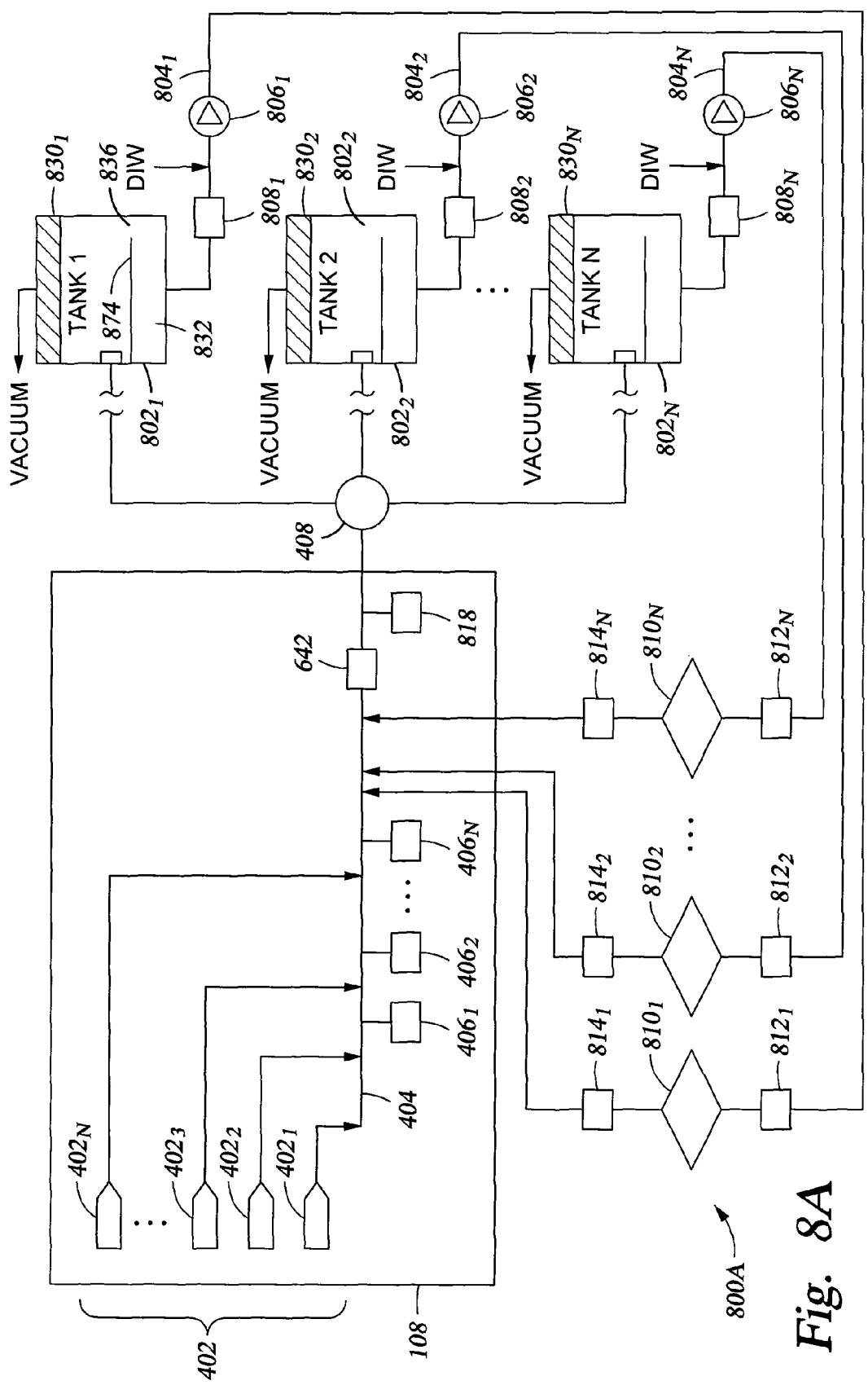
FIG. 8A is a diagram of a processing system having a reclamation system, according to one embodiment of the present invention.

As noted above, in one embodiment of the present invention, fluids removed from processing stations (or, more generally, points of use) are reclaimed and reused. Referring now to FIG. 8A, one embodiment of a reclamation system 800A is shown. The reclamation system 800A includes a number of components previously described with respect to FIG. 4, and those components are identified by like numbers and will not be described again in detail. Further, for clarity a number of items previously described have been removed. In general, the reclamation system 800A includes the blender 108 and a plurality of tanks $802_{1-N}$ (collectively tanks 802). The tanks 802 correspond to the tank 436 shown in FIG. 4 and, therefore, each tank is fluidly coupled to a respective processing station (not shown) and may also be fluidly coupled to the vacuum pump subsystem 120 (not shown).

In one embodiment, the tanks 802 are configured to separate liquids from gases in the incoming liquid-gas streams. To this end, the tanks 802 may each include an impingement plate $828_{1-N}$ at an inlet of the respective tanks. Upon encountering the impingement plate 828, liquid is condensed out of the incoming fluid streams by operation of blunt force. The tanks 802 may also include demisters $830_{1-N}$. The demisters 830 generally include an array of surfaces positioned at angles (e.g., approximately 90 degrees) relative to the fluid being flowed through the demister 830. Impingement with the demister surfaces causes further condensation of liquid from the gas. Liquid condensed from the incoming stream is captured in a liquid storage area $832_{1-N}$ at a lower portion of the tanks, while any remaining vapor is removed to the vacuum pump subsystem 120 (shown in FIG. 1). In one embodiment, a degassing baffle $834_{1-N}$ is positioned below the demisters, e.g., just below the impingement plates 828. The degassing baffle extends over the liquid storage area 832 and forms an opening $836_{1-N}$ at one end. In this configuration the degassing baffle allows liquid to enter the liquid storage area 832 via the opening 836, but prevents moisture from the liquid from being reintroduced with the incoming liquid-gas stream.

Each of the tanks 802 is fluidly coupled to the blender 108 via a respective reclamation line $804_{1-N}$ (collectively reclamation lines 804). Fluid flow is motivated from the tanks through their respective reclamation lines 804 by the provision of a respective pump $806_{1-N}$ (collectively pump 806). Fluid communication between the tanks 802 and their respective pumps 806 is controlled by operation of pneumatic valves $808_{1-N}$ (collectively valves 808) disposed in the reclamation lines 804. In one embodiment, the pumps 806 are centrifugal pumps or suitable alternatives such as air operated diaphragm or bellows pumps.

In one embodiment, filters $810_{1-N}$ (collectively filters 810) are disposed in each of the reclamation lines. The filters 810 are selected to remove debris from the reclaimed fluids prior to being introduced into the blender 108. Although not shown, the filters may each be coupled to a flushing system configured to flow a flushing fluid (e.g., DIW) through the filters to remove and carry away the debris caught by the filters. Fluid flow into the filters and into the blender 108 may be managed (e.g., controlled and/or monitored) by the provision of one or more flow management devices. Illustratively, flow management devices $812_{1-N}$, $814_{1-N}$ are disposed in the respective reclamation lines upstream and downstream of the filters. For example, in the illustrative embodiment, the upstream devices $812_{1-N}$ are pneumatic valves (collectively valves 812) are disposed upstream of each of the filters 810. Accordingly, the flow rates of the reclamation fluids may be controlled by operation of the pneumatic valves 812. Further, the downstream devices $814_{1-N}$ include pressure regulators and flow control valves to ensure a desired pressure and flow rate of the fluids being introduced to the blender 108. Each of the flow management devices may be under the control of the controller 126 (shown in FIG. 4).

Each of the reclamation lines 804 terminate at the primary supply line 404 of the blender 108. Accordingly, each of the fluids flowed from the respective tanks may be streamed into and mixed with the solution being flowed through the primary supply line 404. In one embodiment, the reclamation fluids are introduced upstream from a mixing station (e.g., mixer 642 described above with respect to FIG. 6) disposed in line with the primary supply line 404. Further, one or more concentration monitors 818 may be disposed along the primary supply line 404 downstream from the mixer 642. Although only one concentration monitor is shown for convenience, it is contemplated that a concentration monitor is provided for each different chemistry being reclaimed, in which case the reclamation streams may be introduced into the primary supply line 404 at an appropriate point upstream from a respective concentration monitor for the particular stream. In this way, the concentration of a respective chemistry may be monitored at the respective concentration monitor. If the concentration is not within a target range, the blender 108 may operate to inject calculated amounts of the appropriate chemical(s) from the various inputs 402. The resulting solution is then mixed at the mixer 642 and again monitored for concentration at the concentration monitor 818. This process may be continued, while diverting the solution to drain, until the desired concentrations are achieved. The solution may then be flowed to the appropriate point of use.

In some configurations, the chemistries being used at each of the respective processing stations may always be the same. Accordingly, in one embodiment, the various reclamation lines 804 may be input to the appropriate point of use supply lines 410, 412, 414, as is illustrated by the reclamation system 800B shown in FIG. 8B. Although not shown, concentration monitors may be disposed along each of the reclamation lines to monitor the respective concentrations of the reclamation streams being input to the point of use supply lines. Although not shown, mixing zones may be disposed along the point of use supply lines 410, 412, 414 to mix the incoming reclamation streams with the stream from the blender 108. Also, suitable mixing of streams may be achieved by delivering the stream from the blender 108 and the respective reclamation streams at 180 degrees relative to each other. The incoming streams may be mixed at a T-junction coupling, whereby the resulting mixture is flowed toward the respective points of use at 90 degrees relative to the flow paths of the incoming streams.

Figure 8B:
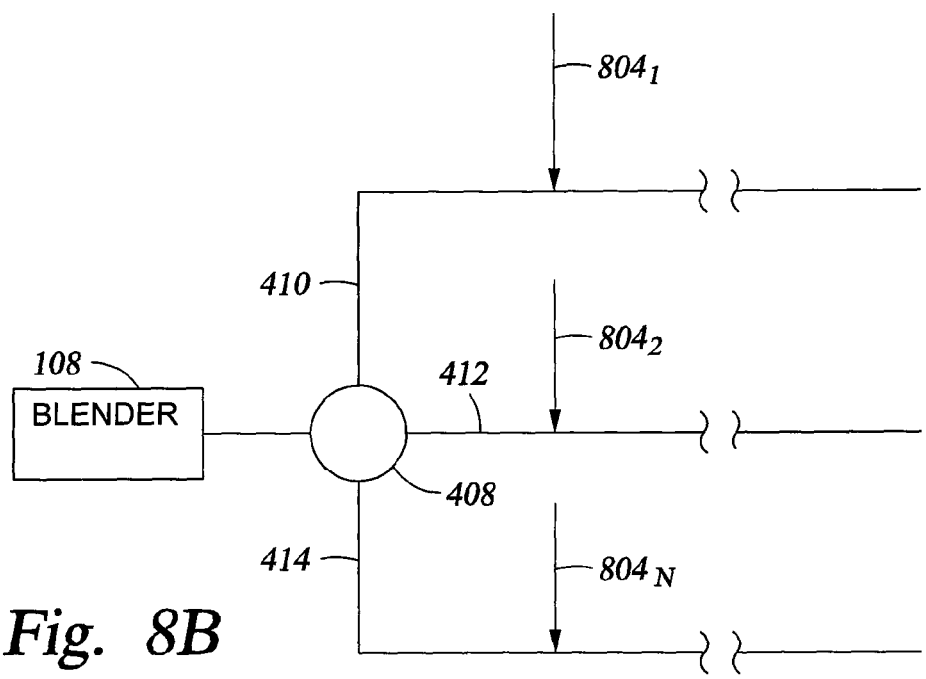
FIG. 8B is a diagram of a processing system having a reclamation system, according to one embodiment of the present invention.
Figure 8C:
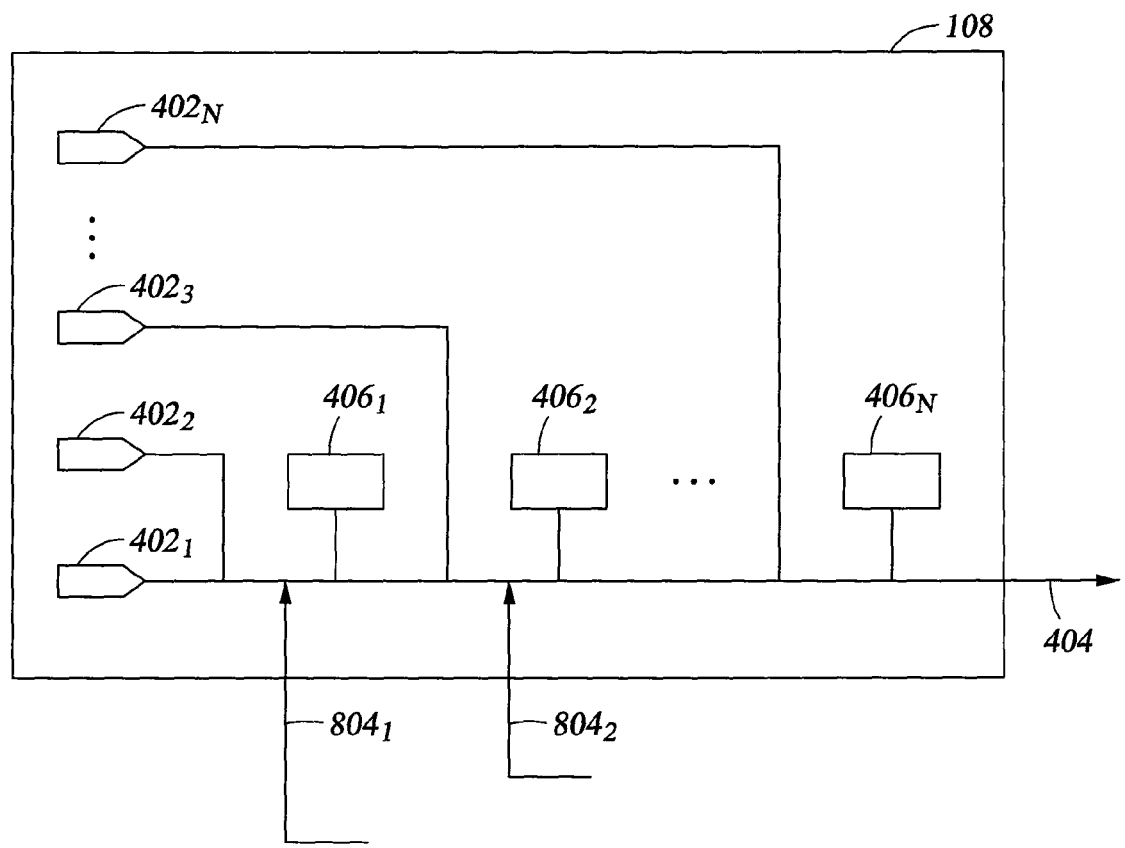
FIG. 8C is a diagram of a processing system having a reclamation system, according to one embodiment of the present invention.

Alternatively, it is contemplated to flow each of the reclamation fluids to a point upstream of the appropriate concentration monitor in the blender 108, as is illustrated by the reclamation system 800C shown in FIG. 8C. For example, a reclaimed solution of diluted hydrofluoric acid from the first reclamation line $804_1$ may be input downstream of a hydrofluoric acid input $402_1$ and upstream of the first concentration monitor $406_1$ configured to monitor the concentration of hydrofluoric acid. A reclaimed solution of SC-1 type chemistry from the second reclamation line $804_2$ may be input downstream of the ammonium hydroxide input $402_2$ and hydrogen peroxide input $402_3$, and upstream of the second and third concentration monitors $406_2$, $406_N$ configured to monitor the concentration of SC-1 type solution constituents. And so on. In one embodiment, distinguishing between various constituents in a mixture of multiple constituents, such as ammonium hydroxide and hydrogen peroxide, is possible by deriving an equation from process modeling using metrology signals and analytical results from titrations. The incoming chemical concentration to the process must be known; more specifically, the concentration of the fluid must be known before decompositions, escape of the $NH_3$ molecule, or formation of any resultant salts or by-products from the chemical processes occurring. In this way, the changing metrology can be observed and the change in components typical for that process can be predicted.

In each of the foregoing embodiments, the reclamation fluids may be filtered and monitored for appropriate concentrations. However, after some amount of time and/or some number of process cycles the reclaimed fluids will no longer be viable for their intended use. Accordingly, and the one embodiment, the solutions from the tanks 804 are only recirculated and reused for a limited time and/or a limited number of process cycles. In one embodiment, the process cycles are measured in number of wafers processed. Thus, in a particular embodiment, a solution of a given chemistry for a given process station is reclaimed and reused for N wafers, where N is some predetermined integer. After N wafers have been processed, the solution is diverged to drain.

It should be understood that the reclamation systems 800A-C shown in FIGS. 8A-C are merely illustrative of one embodiment. Persons skilled in the art will recognize other embodiments within the scope of the present invention. For example, in another embodiment of the reclamation systems 800A-C, fluids may be alternatively routed from the tanks 802 to an off-board reclamation facility located, e.g., in the subfab. To this end, appropriate flow control devices (e.g., pneumatic valves) may be disposed in the respective reclamation lines 804.

Second Embodiment

Figure 9:
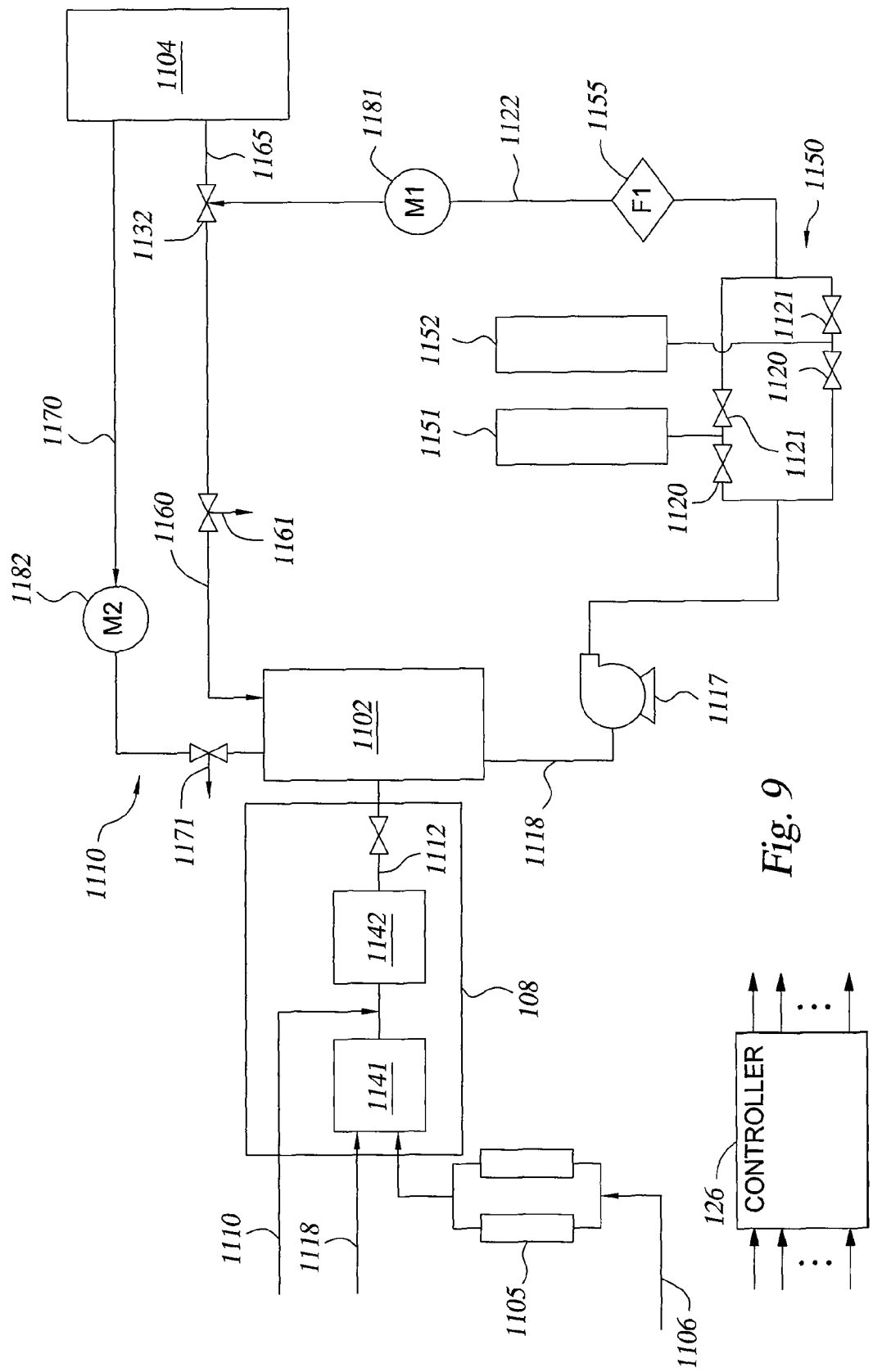
FIG. 9 is a diagram illustrating another embodiment of a reclamation system.

FIG. 9 illustrates an embodiment of a reclamation system for combining fresh chemical solution from the blender and reclaimed chemical solution from the point-of-use (e.g., processing station 1104) and dispensing the combined chemical solutions to the point-of-use. The reclaim system 1100 is configured to measure at least one chemical characteristic of the chemical solution at a location upstream from the point-of-use and a location downstream from the point-of-use. The measured values of the characteristic at the two locations are compared to the desired value or range of values of the characteristic. A measured value that is outside the desired range will trigger one or more adjustments in the system to bring the value within range as will be discussed in more detail below.

The reclaim system 1100 includes a reclaim tank 1102 coupled to the blender unit 108. In one embodiment, the tank 1102 is located upstream from the flow control unit 408 shown in FIG. 4. An inlet of reclaim tank 1102 is connected with the blender unit 108 via a flow line 1112. The flow line 1112 may correspond to the supply line 404 shown in FIG. 4, according to one embodiment. The reclaim tank 1102 is configured to supply the cleaning solution to the point-of-use. The reclamation system 1100 also includes a reclaim line 1170 for returning reclaimed cleaning solution from the point-of-use to the reclaim tank 1102. In one embodiment, the reclaim line 1170 is the reclamation line 448 leaving vacuum tank 436 shown in FIG. 4. The reclaimed cleaning solution is mixed with fresh cleaning solution supplied from the blender unit 108 in the reclaimed tank 1102.

The blender unit 108 may provide continuous control of the blend concentration of the cleaning solution in the flow line 1112. For example, the blender unit 108 may be controlled to provide the make up chemistry necessary to maintain the concentration and/or volume of cleaning solution in the reclaim tank 1102. As noted above, the cleaning solution can be continuously provided from blender unit 108 to tank 1102 at one or more selected flow rates. Alternatively, cleaning solution can be provided from the blender unit to the tank only at selected time periods (e.g., at initial filling of the tank, and when one or more components in the cleaning solution within the tank falls outside of a selected or target concentration range).

In the illustrative embodiment, the cleaning solution formed in the blender unit 108 and provided to the reclaim tank 1102 is a binary solution of hydrofluoric acid (HF) and de-ionized water (DIW). The HF is provided to the blender unit via a supply line 1106, and de-ionized water (DIW) is provided to the blender unit via a supply line 1108. The DIW and the HF may be mixed using a mixer 1141 in the blender. In a particular embodiment, it may be desirable to input heated diluted HF. Accordingly, the blender unit 108 may be configured with an input for heated DIW. In a particular embodiment, the heated DIW may be maintained from about 25° C. to about 70° C. It is noted that the blender unit 108 can be configured to provide a mixture of any selected number (i.e., two or more) of chemical compounds at selected concentrations to any type of tool, where the mixtures can include chemical compounds such as hydrofluoric acid (HF), ammonium fluoride ($NH_4F$), hydrochloric acid (HCl), sulfuric acid ($H_2SO_4$), acetic acid ($CH_3OOH$), ammonium hydroxide ($NH_4OH$), potassium hydroxide (KOH), ethylene diamine (EDA), hydrogen peroxide ($H_2O_2$), and nitric acid ($HNO_3$). To that end, the blender unit 108 may include one or more mixers for combining the chemical compounds at various stages. For example, the blender unit 108 may be configured to dispense solutions of dilute HF, SC-1, and/or SC-2. A SC-1 cleaning solution is a ternary solution containing ammonium hydroxide ($NH_4OH$), hydrogen peroxide ($H_2O_2$), and de-ionized water (DIW).

In addition, any suitable surfactants and/or other chemical additives (e.g., ammonium peroxysulfate or APS) can be combined with the cleaning solutions to enhance the cleaning effect for a particular application. A flow line 1110 is optionally connected with flow line 1112 between the first mixer 1141 and a second mixer 1142 to facilitate the addition of such additives to the cleaning solution for use in the cleaning bath.

In one embodiment, each of the chemical compounds supplied to the blender unit 108 may be stored in a vessel adapted to provide a continuous flow of the chemical compound. Additionally, the supply of chemical compounds may be pressured controlled to provide a stable feed pressure to the blender unit 108. An exemplary chemical vessel assembly 1105 capable of achieving these goals is shown in FIG. 9. The vessel assembly 1105 may comprise a dual vessel assembly wherein each vessel may alternately fill and dispense the chemical compound. In this respect, one vessel may be filling while the other vessel is dispensing the chemical compound, thereby providing a continuous supply to the blender unit 108. Each vessel may have a volume from 2 liters to 6 liters, preferably 3 liters. In one embodiment, the vessel assembly is sized to provide a continuous flow of compounds for a time period from 3 minutes to 10 minutes or sufficient time for at least one cycle of the processing operation. The chemical compounds may be supplied to the blender unit 108 at an inlet chemical pressure from 5 psig to 75 psig, preferably about 15 psig to 35 psig. Additionally, the inlet of the chemical compound to the vessel assembly 1105 may be controlled such that at least one of the vessels in the assembly 1105 can be refilled in a suitable amount of time, for example, from about 10 seconds to 1 minute, preferably 15 seconds. In one embodiment, the vessel assembly 1105 may be filled at a pressure from 0 psig to 75 psig, preferably, from 0 psig to 35 psig. Although a dual vessel assembly is described, it is noted that one or more vessels may be used to store and dispense the chemical compound to the blender unit 108.

The reclaim tank 1102 is adapted to receive and mix cleaning solutions from one of more sources, and thereafter dispense the mixed cleaning solution to the point-of-use. As discussed above, cleaning solution from the blender unit 108 is supplied to the reclaim tank 1102 via line 1112. The reclaim tank may also receive used cleaning solution from a reclaim line 1170 and/or circulated cleaning solution from a recirculation line 1160. Reclaim tank 1102 is suitably dimensioned and configured to retain a selected volume of cleaning solution within the tank (e.g., a sufficient volume to form the cleaning bath for cleaning operations). In one embodiment, the reclaim tank 1102 is sized to retain sufficient cleaning solution for at least one cycle of the processing operation. For example, the tank 1102 may have a volume from about 15 L to about 100 L, and preferably, from about 30 L to 50 L. Tank 1102 may be configured with an overflow section and outlet that permits cleaning solution to exit the tank via overflow line (not shown) while maintaining the selected cleaning solution volume within the tank as cleaning solution is continuously fed to the point-of-use in the manner described below.

The reclaim tank 1102 includes an outlet line 1118 connected to a dispense system 1150 which supplies the cleaning solution to the processing station 1104. The cleaning solution flows into the dispense system 1150 due to the pressure gradient that exists between the reclaim tank 1102 and the dispense system 1150. A pump 1117 may optionally be used to facilitate delivery of the cleaning solution to the dispense system 1150 and/or the processing station 1104.

In one embodiment, the dispense system 1150 includes two or more holding tanks 1151, 1152 (two are shown for purposes of illustration) for storing cleaning solutions from the reclaim tank 1102. As shown, the holding tanks 1151, 1152 are placed in parallel relation with the outlet line 1118 of the reclaim tank 1102. A fill valve 1120 is disposed upstream from each tank 1151, 1152 to selectively control filling of the respective tanks 1151, 1152, and a dispense valve 1121 is disposed downstream from each tank 1151, 1152 to selectively control draining of the respective tanks 1151, 1152. In this respect, the holding tanks 1151, 1152 may be independently operated to fill with or dispense the cleaning solution. The valves 1120, 1121 are preferably electronic valves that are automatically controlled by a controller 126 (previously described above with respect to FIGS. 1-4). In one embodiment, the holding tanks 1151, 1152 may be alternately filled with and dispense the cleaning solution. In this respect, at least one of the holding tanks will be dispensing the cleaning solution to the processing station 1104 to obtain continuous process operations. The cleaning solution from the holding tanks 1151, 1152 is dispensed into the flow line 1122 that supplies the processing station 1104. The volume of the holding tanks may be the same or different sizes. For example, both of the holding tanks may have a volume of 15 L. An optional filter 1155 may be disposed in the flow line 1122 downstream from the holding tanks 1151, 1152. The filter 1155 is selected to remove particles from the solution prior to being delivered to the processing station 1104. In addition, the flow line 1122 can optionally include any suitable number and types of temperature, pressure and/or flow rate sensors and also one or more suitable heat exchangers to facilitate heating, temperature and flow rate control of the solution as it recirculates back to the tank 1102. The flow line 1122 can be useful for controlling the solution bath temperature within the tank during system operation.

A fluid monitor unit 1181 is connected to flow line 1122 at a location downstream from the holding tanks 1151, 1152. As shown, the monitor unit 1181 is located downstream from the filter 1155. The fluid monitor unit 1181 includes at least one sensor configured to measure one or more chemical characteristics (e.g., conductivity or the concentration of one or more chemical compounds) in the cleaning solution (e.g., HF) as the cleaning solution flows through line 1122. The sensor or sensors of fluid monitor unit 1181 can be electrochemical sensor, spectroscopic sensor, or any suitable sensor to facilitate accurate measurements of one or more chemical characteristics of interest in the cleaning solution. In some embodiments, the sensors used in the system are electrodeless conductivity probes and/or Refraction Index (RI) detectors including, without limitation, AC toroidal coil sensors such as the types commercially available under the model 3700 series from GLI International, Inc. (Colorado), RI detectors such as the types commercially available under the model CR-288 from Swagelok Company (Ohio), and acoustic signature sensors such as the types commercially available from Mesa Laboratories, Inc. (Colorado). Suitable sensors also include sensors capable of measuring oxydo-reduction potential, infra-red, ultra-violet, pH, or any other interested characteristics.

In one embodiment, the flow line 1122 may be connected to a process inlet line 1165 of the processing station 1104 and a recirculation line 1160 directed to the reclaim tank 1102. To facilitate distribution of the cleaning solution between the two lines 1160, 1165, an optional three-way valve 1132 may be disposed downstream from the fluid monitor unit 1128. As shown, the flow line 1122 is connected with an inlet of the three-way valve 1132. The three-way valve may be an electronic valve that is automatically controlled by controller 126 in the manner described below based upon concentration measurements provided by unit 1128. The process inlet line 1165 connects with an outlet of valve 1132 and extends to the processing station 1104 to supply cleaning solution for processing operations. The recirculation line 1160 connects to another outlet of valve 1132 to facilitate recirculation of a portion of the solution from the flow line 1122 back to the tank 1102 during normal system operation (as described below). In another embodiment, an optional drain line 1161 may connect with the recirculation line 1160 for draining the recirculation line 1160 if returning the cleaning solution to the tank 1102 is determined to be undesirable. In another embodiment, the cleaning solution in flow line 1122 may be distributed in any suitable manner between the process inlet line 1165 and the recirculation line 1160. For example, a portion, all, or none of the cleaning solution is distributed to the recirculation line 1160. Additional valves or regulators may be used to facilitate distribution of the cleaning fluid.

Recirculation flow line 1160 can include any suitable number and types of temperature, pressure and/or flow rate sensors and also one or more suitable heat exchangers to facilitate heating, temperature and flow rate control of the solution as it recirculates back to the tank 1102. The recirculation line is useful for controlling the solution bath temperature within the tank during system operation. In addition, any suitable number of filters and/or pumps (e.g., in addition to pump 1117) can optionally be provided along flow line 1160 to facilitate filtering and flow rate control of the solution being recirculated back to tank 1102. In one embodiment, the recirculation line 1160 may be used to facilitate mixing of the cleaning solution in the system. For example, after a fresh cleaning solution is added to the reclaim tank 1102, the cleaning solution may be circulated through the recirculation line 1160 one or more times to enhance mixing and promote a homogeneous cleaning solution circulating in the reclaim tank 1102. In another embodiment, the circulating cleaning solution may be monitored to determine if the target concentration or characteristic has been reached prior to supplying the cleaning solution to the processing station 1104. In one embodiment, the process of circulating the cleaning solution may be conducted while the processing station is on standby.

The reclamation system 1100 also includes a reclaim line 1170 connecting an outlet of the point-of-use to the reclaim tank 1102. In one embodiment, the reclaim line 1170 is the reclamation line 448 shown in FIG. 4. The reclaim line 1170 directs reclaimed cleaning solution from the processing station to the reclaim tank 1102. A second fluid monitor unit 1182 is disposed in reclaim line 1182. The second fluid monitor unit 1182 may be configured to measure the same or different chemical characteristic as the first fluid monitor unit 1181. An optional drain line 1171 may connect with the reclaim line 1170 for drainage of the reclaim line 1170 if return to the tank 1102 is not appropriate. It must be noted that reclaim line 1170 can also include any suitable number and types of temperature, pressure and/or flow rate sensors and also one or more suitable heat exchangers to facilitate heating, temperature and flow rate control of the solution as it recirculates back to the tank 1102.

The reclamation system 1100 includes a controller 126 that automatically controls components of the blender unit 108 as well as drain valves 1161, 1171 based upon chemical characteristics measurements obtained by fluid monitor units 1181, 1182. As described below, the controller may make adjustments to one or more components in the system 1100 depending upon the characteristic of the cleaning solution in the lines 1170, 1160 as measured by the fluid monitor units 1181, 1182.

Controller 126 is disposed in communication with fluid monitor units 1181, 1182, drain valves 1161, 1171, and valve 1132, as well as certain components of blender unit 108 via any suitable electrical wiring or wireless communication link to facilitate control of the blender unit and valves based upon measured data received from the fluid monitor units. Exemplary communication protocols include Ethernet or dry contacts. The controller includes a processor that is programmable to implement any one or more suitable types of process control, such as proportional-integral-derivative (PID) feedback control. An exemplary controller that is suitable for use in the process control blender system is a PLC Simatic S7-300 system commercially available from Siemens Corporation (Georgia).

Based upon measurements provided by fluid monitor units 1181, 1182, the controller 126 may be configured to implement one or more changes in the system 1100. In one embodiment, fluid monitor units 1181, 1182 may be configured to measure the conductivity of a cleaning solution. The measured conductivity values may be compared to a stored range of compliant or target values. If the measured value is within the compliant range, the controller 126 may allow operation to proceed without any changes. However, if the measured value is outside the compliant range, the controller 126 may make one of more changes to the system 1100. The controller 126 may drain the recirculation line 1160 or the reclaim line 1170, change the chemistry of the fresh cleaning solution, or implement combinations thereof, such as partial drain of the reclaim line 1170 and change the chemistry. The chemistry change of the fresh cleaning solution may involve changing the concentration and/or the flow rate of the cleaning solution. In one embodiment, the fresh cleaning solution may be a high concentration, low flow rate solution, which is also referred to as a "spike." In one example, if a decrease in concentration is measured in the reclaim line 1170, the controller may make up for the decrease by increasing the concentration of the fresh cleaning solution supplied to the tank, thereby bringing the cleaning solution in the tank within compliant or target concentration ranges. Once the concentration of the cleaning solution comes within acceptable ranges, as measured by fluid monitor unit 1182, the controller is programmed to control the blender unit so as to reduce (or decease) the concentration while maintaining the desired compound concentrations of the mixture of cleaning solution in the tank 1102. In another example, if the measured value at fluid monitor unit 1181 is out of range, it may be an indication that the concentration is below the target level. The controller may respond by draining the cleaning solution and replenishing the chemistry prior to dispensing the cleaning solution at the point-of-use for processing. In yet another example, if the measured value at fluid monitor unit 1182 is out of range, the controller may drain reclaim line 1170 via drain line 1171 instead of returning the used cleaning solution to the reclaim tank 1102. It is contemplated that even if the measured value falls within the desired range, the controller may nevertheless implement changes to the system.

In another embodiment, the measured value of the fluid monitor units 1181, 1182 may be used to determine an object characteristic. In turn, the object characteristic value is compared to the compliant range of values for that characteristic to determine whether any changes to the reclamation system 1100 is required. In one embodiment, the fluid monitor units 1181, 1182 may be configured to measure conductivity of the cleaning fluid. The controller 126 may be configured to convert a conductivity value to concentration value. For example, the controller 126 may be programmed with data or a mathematical equation for performing the conversion. The conductivity value measured by the fluid monitor units 1181, 1182 is used to determine the concentration value. The controller 126 may compare the associated concentration value to the compliant range of concentration values and implement changes to the system as necessary. For solutions have multiple chemical compounds, such as a ternary blend or a quaternary blend, additional sensors may be used to facilitate determination of the object characteristic. To that end, the controller 126 may be programmed with any suitable data or model for determining another characteristic from the measured characteristic (e.g., determining concentration from measured refractive index) to allow the controller 126 to determine whether a change to the system is required. In one embodiment, the reclamation system 1100 operating with a ternary cleaning solution such as SC-1 may be equipped with two sensors for measuring two different characteristics of the solution at the flow line 1122 and two sensors for measuring the same two characteristics of the solution at the reclaim line 1170. One sensor may be used to measure conductivity, while the other sensor may be used to measure refractive index. The concentration of the ammonium hydroxide and the hydrogen peroxide in the cleaning solution may be derived from the two measured characteristics. The derived concentration of each compound may then be compared to compliant values to determine whether a change to the system is necessary.

An exemplary embodiment of a method of operating the system described above and depicted in FIG. 9 is described below. In this exemplary embodiment, cleaning solution can be continuously provided to the tank or, alternatively, provided only at selected intervals to the tank (e.g., when cleaning solution is to be displaced from the tank). A binary cleaning solution containing HF and DIW is prepared in blender unit 108 and provided to tank 1102 with a concentration of HF in a range from about 0.01-15% by weight, preferably about 5% by weight.

In operation, the supply of the HF and the DIW may be pressure controlled to provide a stabilized feed pressure to the blender unit 108. In one embodiment, the HF is stored in a dual vessel assembly 1105 wherein each vessel has a volume of 3 liters. Initially, the vessel assembly 1105 may be filled using a pressure of 0 psig. Thereafter, the HF may be supplied to the vessel assembly 1105 at a minimum pressure of 5 psig and 5 liters per minute (LPM). The vessel assembly 1105 is sized to provide a continuous flow of HF for 3 minutes to 10 minutes. The DIW may be supplied to the blender 108 at a minimum pressure of 35 psig and 30 LPM. Both of the chemical compounds are supplied at a temperature from 20° C. to 25° C.

The controller 126 controls the blender unit 108 to provide cleaning solution to tank 1102 via flow line 1112 at a flow rate from about 0-35 liters per minute (LPM). The blender can provide solution continuously or, alternatively, at selected times during system operation. The reclaim tank 1102 may have a volume of 40 liters. The tank may initially be supplied with cleaning solution containing HF at 5% by weight of the solution. The cleaning solution may be supplied to the tank 1102 at a flow rate of 0.5 LPM to 30 LPM. The temperature of the cleaning solution in the reclaim tank 1102 is in a range from 20° C. to 25° C. or about room temperature. Additives (e.g., APS) can optionally be added to the cleaning solution via supply line 1114.

The cleaning solution is supplied from the tank 1102 into the outlet line 1118 at a flow rate of about 25 LPM. The cleaning solution is directed to the two holding tanks 1151, 1151 in the dispense system 1150. The holding tanks are configured to alternatively fill and dispense the cleaning solutions to the processing station 1104. As shown, each holding tank 1151, 1152 has a volume of 15 liters. To fill the holding tanks, the fill valve 1120 of the first holding tank 1151 is opened. The cleaning solution flows into the first holding tank 1151 under the pressure gradient between the reclaim tank 1102 and the first holding tank 1151. After filling to a predetermined volume, the fill valve 1120 for the first holding tank is closed, and the fill valve 1120 for the second holding tank 1152 is opened. It must be noted that both holding tanks may be opened during the initial filling or if processing operation is conducted at predetermined intervals. While the second holding tank 1152 is being filled, the dispense valve 1121 of the first holding tank 1151 is opened to dispense the cleaning solution at 22 LPM into the flow line 1122 for use by the processing station 1104. After filling to a predetermined level, the fill valve 1120 for the second holding tank 1152 is closed and the dispense valve 1121 is opened. At the same time, the dispense valve 1121 for the first holding tank 1151 is closed and the fill valve 1120 is opened. This alternating cycle of filling and dispensing the cleaning solution between the two holding tanks 1151, 1152 ensures a continuous flow of cleaning solution to the processing station 1104. In another embodiment, after the second tank has been filled, the dispense valve for the second holding tank 1152 may remain closed until the first holding tank is ready to stop dispensing the cleaning solution. The cleaning solution dispensed from the holding tanks 1151, 1152 may pass through a filter 1155 to remove any unwanted debris. In one embodiment, the filter 1155 is a 0.1 micron, 10 inch cartridge PTFE filter.

Figure 11:
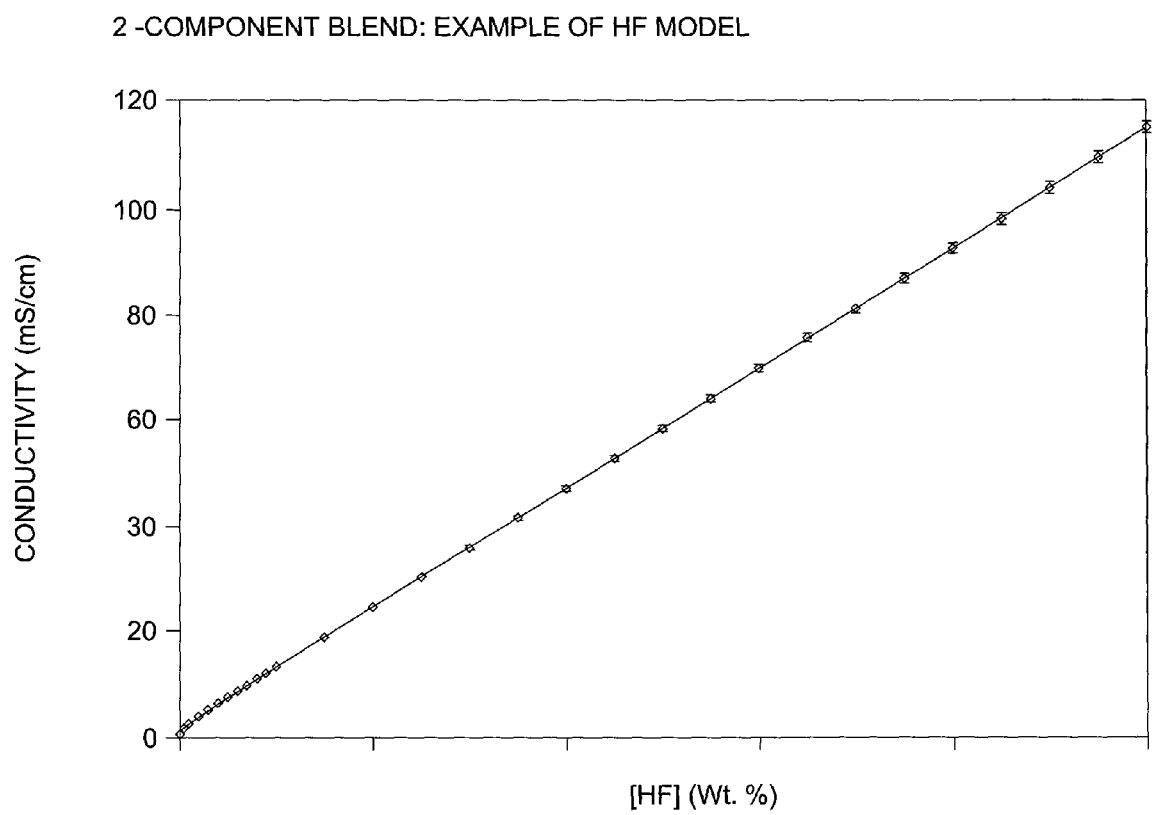
FIG. 11 is a graph illustrating an exemplary relationship between concentration and conductivity for a HF solution.

The concentration of the cleaning solution in the flow line 1122 is monitored by the controller 126 on the basis of input received from the fluid monitor unit 1181. In this example, the fluid monitor unit 1181 is provided with a sensor for measuring the conductivity of the cleaning solution. The controller 126 is configured to calculate concentration as a function of conductivity. If the corresponding concentration is determined to have deviated from the target range of concentration values, the controller may choose to drain the cleaning solution by controlling the 3-way valve 1132 to divert all of the solution to the drain line 1161 in the recirculation line 1160. Alternatively, the controller may drain a portion of the cleaning solution and instruct the blender unit 108 to provide a more concentrated cleaning solution to replenish the loss HF. In one embodiment, the controller 126 is provided with a model or data for deriving concentration from conductivity values. FIG. 11 is an illustration of an exemplary relationship between concentration and conductivity in graphical form. In one example, the concentration of the HF solution may be derived by locating a measured conductivity value on the graph. The controller may compare the derived to the target range of concentration value. If within range, the controller 126 may allow the process to proceed without making any changes. In some instances, the relationship between conductivity and concentration may change depending on the temperature. A temperature gauge may be used to measure the temperature of the cleaning solution to properly determine the functional relationship between conductivity and concentration.

The cleaning solution in the flow line 1122 may be distributed between the process inlet line 1165 and the recirculation line 1160 by adjusting the 3-way valve 1132. In this example, the process inlet line 1165 has 12 LPM of cleaning solution, and the recirculation line has 10 LPM of cleaning solution. The pressure in the lines 1165 and 1160 may be 45 psig. The cleaning solution in the process inlet line is supplied to the processing station 1104, while the cleaning solution in the recirculation line 1160 is returned to the reclaim tank 1102.

The cleaning solution is circulation to one or more chambers in the processing station 1104 for use during process. One cycle of processing may involve controlling the chamber between an ON period and an OFF period. In this example, the chamber may be turned ON for 48 seconds for processing and then turned OFF for 12 seconds. During the ON period, the cleaning solution may experience a 25% loss in volume and a 20% loss in concentration. During the OFF period, the cleaning solution may experience no loss in volume, but may suffer a less than 20% loss in concentration. As a result, the cleaning solution leaving the reclaim line 1170 during the ON period may have a flow rate of 9 LPM and a concentration of 4% by weight. The cleaning solution in the reclaim line 1170 may have a pressure of 30 psig.

The loss in concentration and flow rate can be monitored by the flow monitor unit 1182. In this example, the conductivity value measured by the flow monitor unit 1182 results in a concentration value that is outside the target concentration range of values as determined from the graph in FIG. 11. The loss in concentration will trigger a response from the controller 126 to increase the concentration of the fresh cleaning solution. The controller 126 can increase the concentration of the fresh cleaning solution supplied to the reclaim tank 1102 to 5.05% by weight to replenish the decreased concentration in the reclaimed cleaning solution. Also, the 3 LPM flow rate loss in the reclaim cleaning solution is also detected by the flow rate meter in the flow monitor unit 1182. The controller 126 may respond by supplying the 5.05% cleaning solution at 3 LPM to the reclaim tank 1102. In this manner, the reclamation system 1100 provides an effective reclaim and blend capability for maintaining a target level of circulation and concentration of the cleaning solution.

Figure 10:
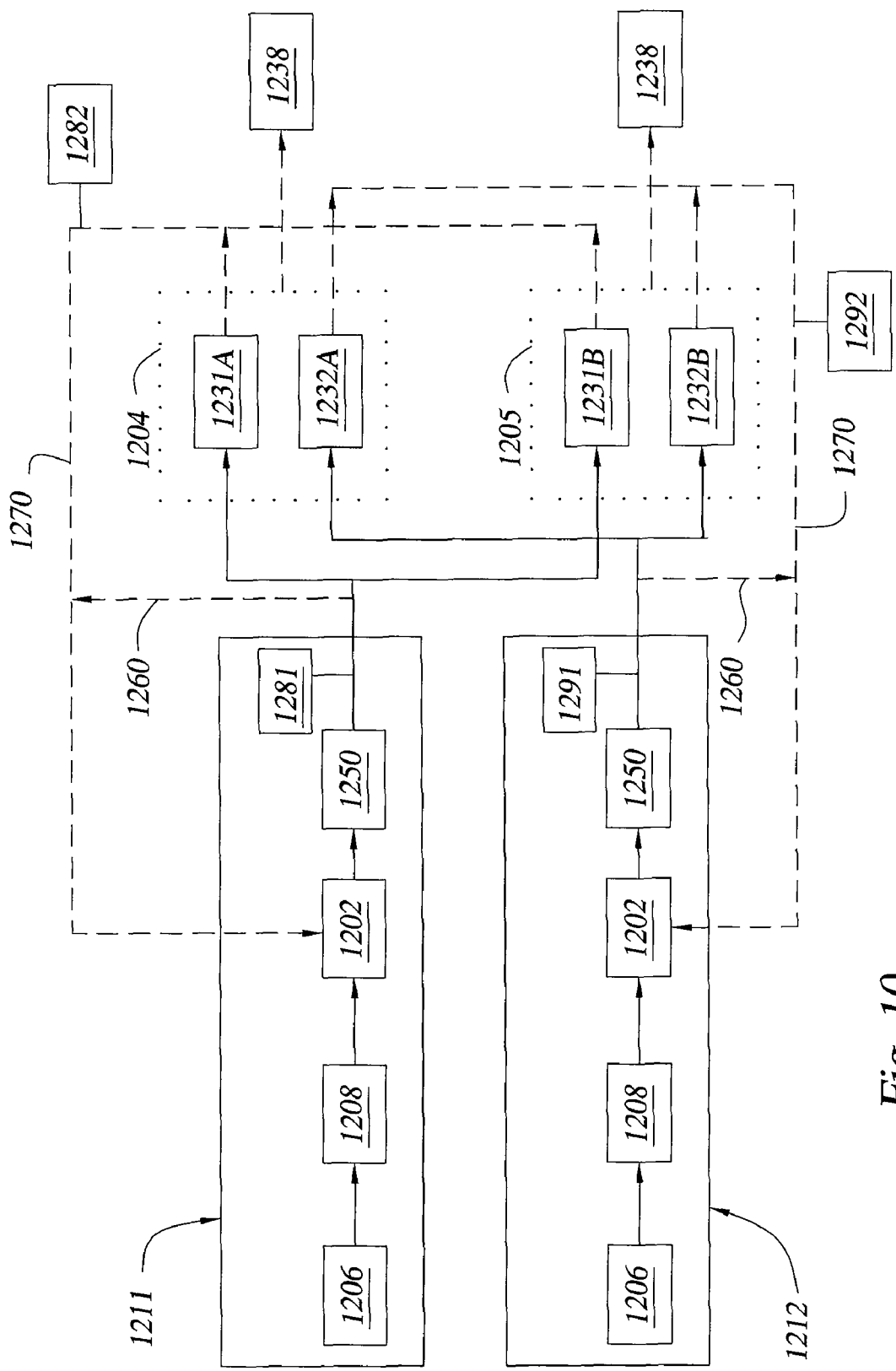
FIG. 10 is a diagram illustrating an embodiment of dual chemistry reclamation system.

FIG. 10 shows a schematic view of a processing system 1200 for supplying two different chemistries to two processing stations. The processing system 1200 includes a first blend system 1211 for supplying a first chemistry and a second blend system 1212 for supplying a second chemistry. For example, the first chemistry may be a HF cleaning solution and the second chemistry may be a SC-1 cleaning solution. Each blend system 1211, 1212 is adapted to supply its respective chemistry a first processing station 1204 and a second processing station 1205. Although two processing stations are described, it must be noted that each blend system may be configured to supply the chemical solution to any suitable number of processing stations. It must further be noted that the number of blend systems may correspond to the number of different chemistries required for the particular process.

Each blend system 1211, 1212 includes a chemistry inlet 1206, a blender 1208, a reclaim tank 1202, and a dispense system 1250. Each component is substantially similar to the inlet 1106, 1108, the blender unit 108, the reclaim tank 1102, and the dispense system 1150 described with respect to FIG. 9, and for convenience and clarity will not be described in detail. Each system may function in a manner similar to the system 1100 described with respect to FIG. 9. For example, the chemistry inlet 1206 for the first blend system 1211 may include chemistry inlet lines such as HF inlet line 1106 and DIW inlet line 1108. The chemistry inlet 1206 for the second blend system 1212 may include inlet lines for supplying the ammonium hydroxide, hydrogen peroxide, and DIW. The inlet lines are configured to supply the chemical compounds to the respective blender unit 1208.

The blender unit 1208 mixes the chemical compounds and supplies the freshly mixed chemical solution to the reclaim tank 1202. The reclaim tank 1202 mixes the fresh chemical solution with solution already in the reclaim tank 1202 along with chemical solution returning from the reclaim line 1270 and the recirculation line 1260. In turn, reclaim tank 1202 supplies the mixed chemical solution to the dispense system 1250, where the chemical solution is dispensed to the processing stations 1204, 1205.

As shown in FIG. 10, chemical solution having the first chemistry from the first blend system 1211 may be dispensed to at least two processing stations 1204, 1205. The chemical solution can be dispensed to a first chemistry chamber 1231A in the first processing station 1204 and to a first chemistry chamber 1231B in the second processing station 1205. Additionally, a portion of the chemical solution can be circulated back to the reclaim tank 1202 via recirculation line 1260. The used chemical solution may be reclaimed and returned to the reclaim tank 1202 via reclaim line 1270. In one embodiment, at least a portion of the chemical solution may be drained from the processing station 1204 via drain line 1238.

Similarly, chemical solution having the second chemistry from the second blend system 1212 may be dispensed to at least two processing stations 1204, 1205. The chemical solution can be dispensed to a second chemistry chamber 1232A in the first processing station 1204 and to a second chemistry chamber 1232B in the second processing station 1205. Additionally, a portion of the chemical solution can be circulated back to the reclaim tank 1202 via recirculation line 1260. The used chemical solution may be reclaimed and returned to the reclaim tank 1202 via reclaim line 1270. In one embodiment, at least a portion of the chemical solution may be drained from the processing station 1204 via drain line 1238.

Each blend system 1211 and 1212 may include fluid monitor units for monitoring a characteristic of the chemical solutions in each system. The fluid monitor units can be used to maintain the concentrations of the chemicals in the reclaim tank and maintain the tank volume within a controlled range. In one embodiment, the first blend system 1211 may include a first monitor unit 1281 disposed upstream from the processing stations to monitor the chemical solution prior to processing. The measurements made by the first monitor unit 1281 may be used to verify the chemistry in the chemical solution is within the target range for use in processing. The first blend system may also include second monitor unit 1282 disposed downstream from the processing stations to monitor the chemical solution after processing and before returning to the reclaim tank 1202. The measurements made by the second monitor unit 1282 may be compared to the measurements made at the first monitor unit 1181 to determine chemistry degradation. If the measurements are out of range, the controller may send the chemical solution to drain and/or provide makeup chemistry from the blender unit 1208 to maintain the chemistry in the reclaim tank within range of specification. In one embodiment, the chemical solution in the first blend system 1211 is a binary solution such as HF and DIW. The first and second monitor units 1181, 1182 may be configured to measure the conductivity of the binary solution to determine the concentration of the HF in the solution. Depending on the concentration measured, the controller 126 may respond appropriately to maintain or return the concentration to the target range.

Similarly, the second blend system 1212 may include a first monitor unit 1291 disposed upstream from the processing stations to monitor the chemical solution prior to processing. The measurements made by the first monitor unit 1291 may be used to verify the chemistry in the chemical solution is within the target range for use in processing. The second blend system 1212 may also include second monitor unit 1292 disposed downstream from the processing stations to monitor the chemical solution after processing and before returning to the reclaim tank 1202. The measurements made by the second monitor unit 1292 may be compared to the measurements made at the first monitor unit 1291 to determine chemistry degradation. If the measurements are out of range, the controller may send the chemical solution to drain and/or provide makeup chemistry from the blender unit 1208 to maintain the chemistry in the reclaim tank within range of specification.

In one embodiment, the chemical solution in the second blend system 1212 is a ternary solution such as SC-1, which contains a mixture of ammonium hydroxide, hydrogen peroxide, and DIW. To determine a particular characteristic of the ternary chemical solution (e.g., concentration), measurement of two different characteristics at the fluid monitor units may be required. This is because the ternary chemical solution includes an additional unknown value (e.g., the third chemical component) that may require the measurement of an additional characteristic. For example, to determine the concentrations of each chemical, the fluid monitor units 1291, 1292 may be configured to measure conductivity and refractive index. The measured values are then used to determine the concentration of the ammonium hydroxide and the hydrogen peroxide. The concentrations of each chemical are compared to the target range to determine compliance. Depending on the concentration values, the controller 126 may respond by adjusting one or both chemicals' concentration in the fresh chemical solution. In addition or alternatively, the controller may drain the chemical solution and adjust the flow rate and/or the concentration of the fresh chemical solution to return the chemical solution in the reclaim tank 1202 to within target levels.

Figure 12:
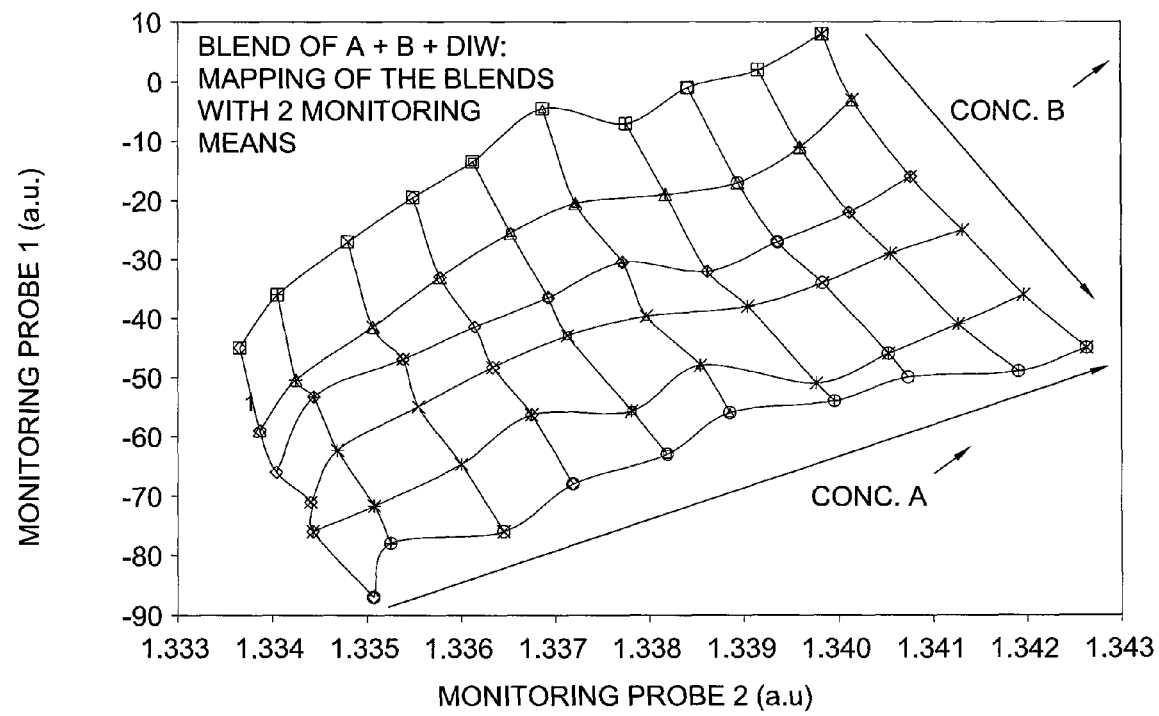
FIG. 12 is a graph illustrating the refractive index and reduction potential values of a SC-1 solution at different concentration.

FIG. 12 illustrates an exemplary model for deriving a concentration of the chemical compounds in a ternary solution such as SC-1. In this example, the model is prepared by measuring the refractive index value and the reduction potential value of various known blends (i.e., concentrations) of the SC-1 solution containing a mixture of ammonium hydroxide, hydrogen peroxide, and DIW. The measured values are presented in graphical form as shown in FIG. 12. For each blend, the refractive index is shown on the x-axis, and the reduction potential is shown on the y-axis. In the Figure, concentration "A" refers to the concentration of the hydrogen peroxide and concentration "B" refers to the concentration of ammonium hydroxide in a particular blend. It can be seen that as the concentration for either chemical increases, the refractive index also increases in value. In contrast, the reduction potential increases as concentration A increases, but the reduction potential decreases as concentration B increases.

As discussed above, determination of a particular characteristic of the ternary chemical solution (e.g., concentration) may require measurement of two different characteristics. Using the embodiment shown in FIG. 10, the fluid monitor units 1291, 1292 are configured to measure refractive index and reduction potential of the cleaning solution. To this end, the fluid monitor units 1291, 1292 can be equipped with two sensors.

In operation, fluid monitor unit 1291 can be used to determine the concentration of the cleaning solution prior to processing. Initially, the fluid monitor unit 1291 measures the refractive index and the reduction potential of the cleaning solution. From the two measured values, the controller 126 can determine the concentration of each chemical by comparing the measured values to the model shown in FIG. 12. Because each point on the graph is associated with a known concentration value, the concentration of cleaning solution can be derived by mapping the measured values. Thereafter, the controller 126 can compare the derived concentration value to a target range of concentration values to determine if the cleaning solution is within specifications. If the derived value is within specifications, the controller 126 may allow the process to proceed without making changes.

Fluid monitor unit 1292 can use the same procedure to determine the concentration of the cleaning solution after processing. Initially, the fluid monitor unit 1292 measures the refractive index and the reduction potential of the cleaning solution. The two measured values are mapped on FIG. 12 to determine the known concentration value associated with those particular measured values. Thereafter, the controller 126 can compare the derived concentration value to a target range of concentration values to determine if the cleaning solution is within specifications. If the derived value is not within specifications, the controller 126 may make changes to the system.

Figure 13:
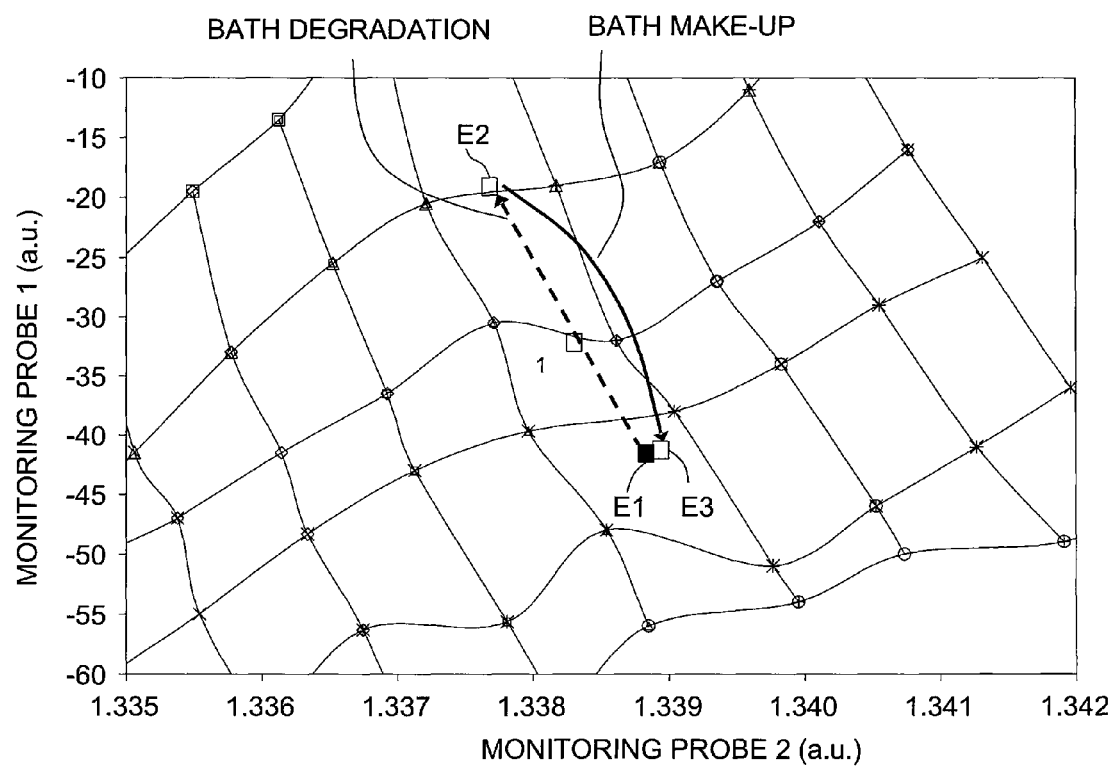
FIG. 13 is an enlarged partial view of FIG. 12 illustrating an example of adjusting a concentration of the solution.

FIG. 13 illustrates an example of adjusting the system to bring the concentration value within the target range. FIG. 13 is an enlarged partial view of FIG. 12. The initial concentration of solution has measured refractive index reduction potential values represented by E1 in FIG. 13. During operation, these measured values change to the values represented by E2. From the E2 values, the controller 126 can determine that the concentration of the solution has degraded. In response, the controller may instruct the blender to supply a higher concentration of solution to make-up for the loss chemistry. E3 represents the refractive index and reduction potential values after the make-up solution has been supplied to the reclaim tank. It can be seen that the E3 values are substantially close to the E2 values, representing that the solution now has a concentration that is substantially the same as the initial concentration or is within the target range of concentration.

Figure 14:
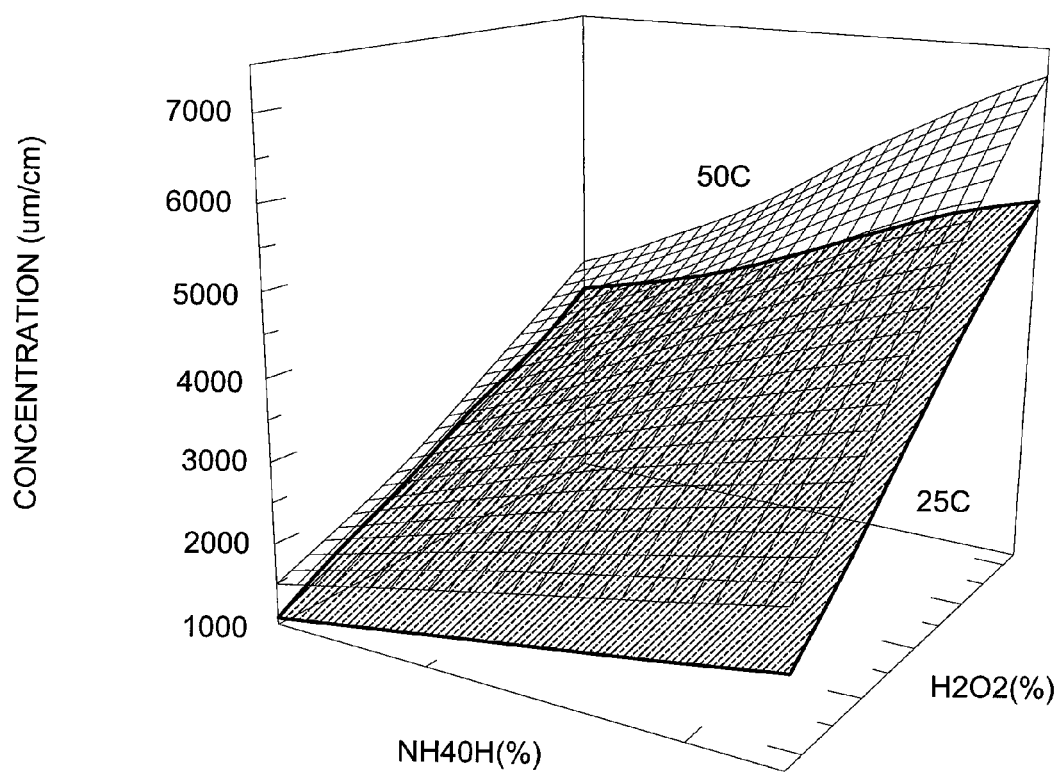
FIG. 14 is a graph illustrating the effect of temperature on concentration.

As noted above, a change in temperature other system parameters may affect the relationship between characteristics of the chemical solution. FIG. 14 illustrates an example of the effect of a temperature change on conductivity of a SC-1 solution. In the Figure, the conductivity is measured for SC-1 solutions containing different concentrations of hydrogen peroxide and ammonium hydroxide and plotted on a 3 coordinate graph. The conductivity is measured for the solutions at two different temperatures, specifically, 25° C. and 50° C. It can be seen that an increase in temperature has an effect of increasing the conductivity. In one embodiment of the present invention, the system can include one or more temperature gauges to measure the temperature at different locations in the system. For example, at least one of the fluid monitor units is equipped with a temperature gauge for measuring temperature upstream and/or downstream from the processing station.

Figure 15:
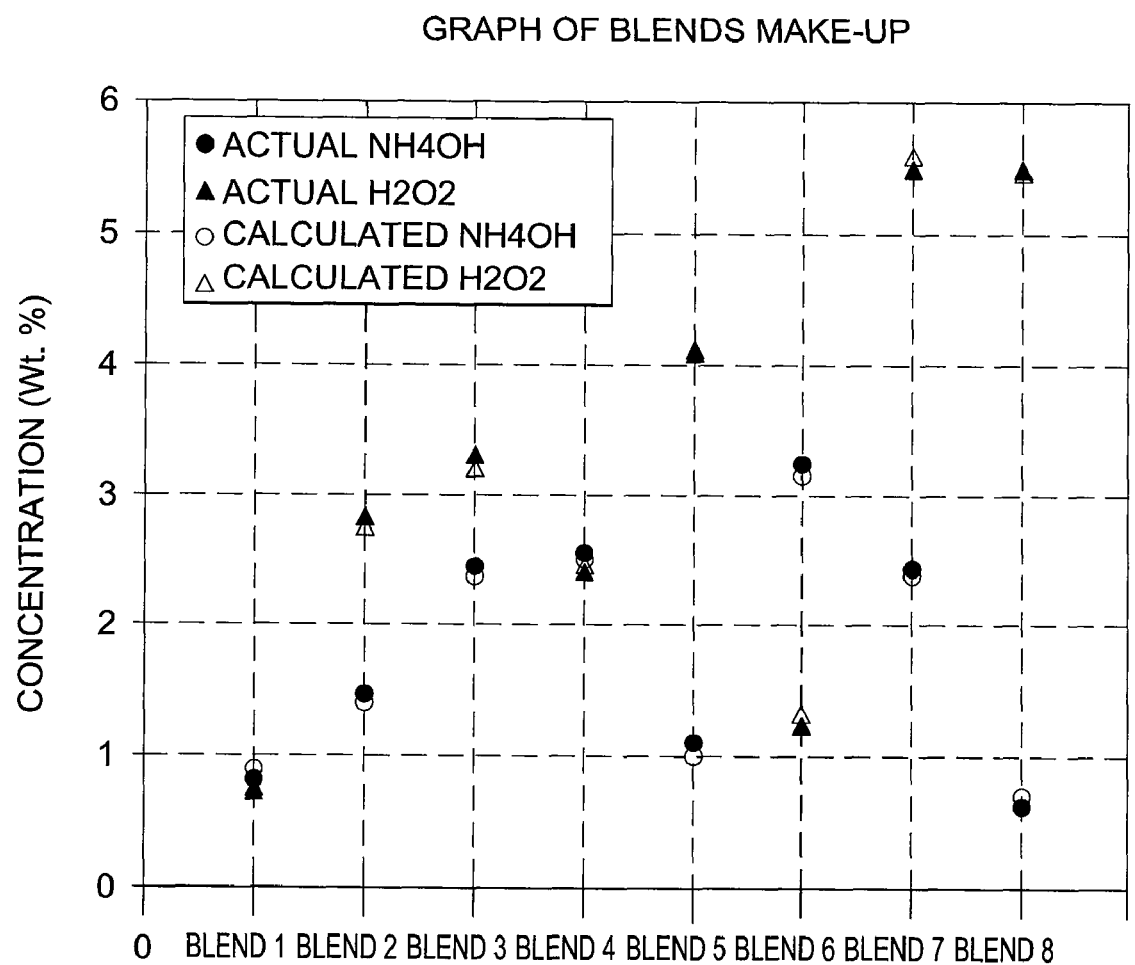
FIG. 15 illustrates a comparison of actual concentration values to a concentration value derived using an exemplary method according to one embodiment of the present invention.

FIG. 15 illustrates a comparison of actual concentration values to a concentration value derived using a model such as the one shown in FIG. 12. In this comparison, eight different blends of SC-1 are used. Initially, the actual concentrations of each chemical, i.e., ammonium hydroxide and hydrogen peroxide, are plotted on the graph. Then, those concentrations are blindly chosen for measurement of their refractive index and reduction potential values. The measured values are compared to a model such as that shown in FIG. 12 to derive a concentration value as described above. The derived concentration values are mapped on FIG. 15, as represented by the "calculated" value points on the graph. It can be seen that the values derived from a model such as FIG. 12 are substantially close to the actual concentrations. In this respect, these results illustrate the accuracy and repeatability of using a model such as FIG. 12.

Vacuum Pump Subsystem

Figure 16A:
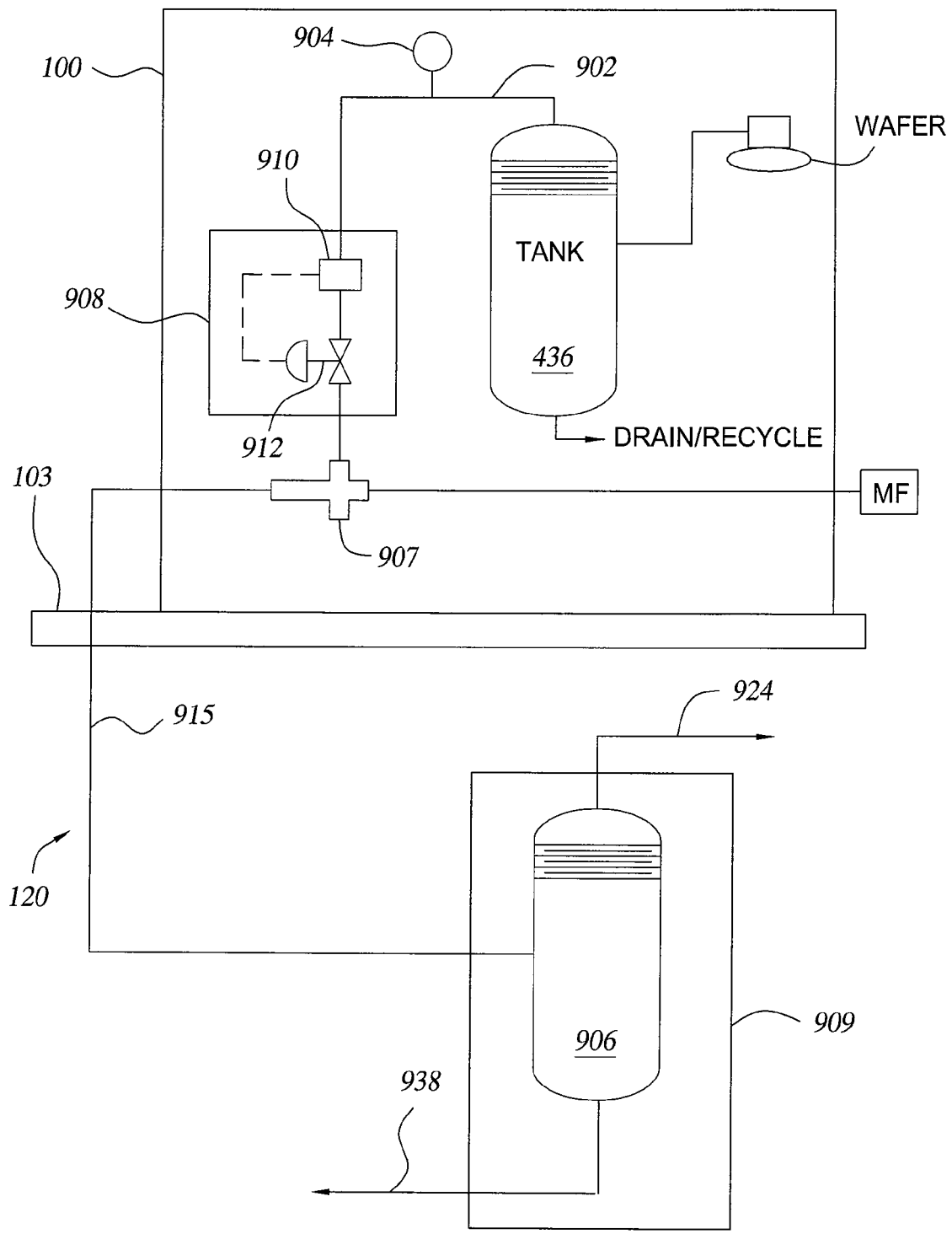
FIG. 16A is a diagram of a vacuum pump system, according to one embodiment of the present invention.

FIG. 16A shows an embodiment of the vacuum pump subsystem 120 suitable for use with the processing system 100. The vacuum pump subsystem 120 may include a pump 907 and a fluid collection unit 909. As shown, the pump is integrated with the processing tool located inside the clean room environment 103, and the fluid collection unit 909 is located outside of the clean room 103, for example, in a utility room where gas or electricity sources may be located. In general, the vacuum pump subsystem 120 may operate to collect waste fluids and separate gases from the fluids to facilitate waste management. Accordingly, the vacuum pump subsystem 120 is coupled to each of the vacuum tanks 436, 438 (shown in FIG. 4) and vacuum tank 802 (shown in FIG. 8) by a vacuum line 902. Thus, the vacuum line 902 may be coupled to the respective vacuum lines 444 and 446 shown in FIG. 4. Although not shown in FIG. 16A, one or more valves may be disposed in the vacuum line 902 and/or the respective vacuum lines (e.g., lines 444 and 446 shown in FIG. 4) of the vacuum tanks, whereby a vacuum may be selectively placed on the respective tanks, which, as previously noted, are coupled to the output lines 210 of the processing stations 204. Further, a vacuum gauge 904 may be disposed in the vacuum line 902 in order to measure the pressure in the vacuum line 902.

In one embodiment, an active pressure control system 908 is disposed in the vacuum line 902. In general, the active pressure control system 908 operates to maintain a desired pressure in the vacuum line 902. Controlling the pressure in this way may be desirable to ensure process control over processes being performed in the respective processing stations 204 (shown in FIG. 4, for example). For example, assuming a process being performed in a given processing station 204 requires that a pressure of 400 Torr be maintained in the vacuum line 902, the active pressure control system 908 may be operated under PID control (in cooperation with the controller 126) to maintain the desired pressure.

In one embodiment, the active pressure control system 908 includes a pressure transmitter 910 and a pressure regulator 912, which are an electrical communication with each other. The pressure transducer 910 measures the pressure in the vacuum line 902 and then issues a signal to the pressure regulator 912, causing the pressure regulator 912 to open or close a respective variable orifice, depending on a difference between the measured pressure and the set (desired) pressure.

In one embodiment, the pump 907 is located downstream from the active pressure control system 908. The pump 907 is adapted to place a vacuum on the vacuum line 902. In a particular embodiment, the pump 907 is a venturi vacuum generator. While the operation of venturi vacuum generators is well-known, a brief description is provided here. It is understood, however, that embodiments of the present invention are not limited to particular operational or structural aspects of venturi vacuum generators. In general, a venturi vacuum generator 907 operates to remove gases and mists by flowing a motive fluid (MF) through a narrow tube to increase the motive fluid's velocity. The vacuum is generated when a pressure drop is produced from the increase in velocity of the motive fluid.

The motive fluid for the venturi vacuum generator 907 may be supplied from any suitable pressurized gas source, for example, compressed dry air ("CDA"), nitrogen, argon, and helium. Other suitable motive fluid include ammonia, hydrogen peroxide, cleaning and etching chemicals, liquid chemical, liquid particle remover, water, and combinations of the above. One or more of these motive fluids are readily found onsite of a typical processing system. As such, one or more of these motive fluids may be selected as a backup motive fluid source. In one embodiment, the motive fluid is supplied at a pressure from about 60 psi to about 100 psi, preferably, from about 75 psi to about 85 psi. The venturi vacuum generator 907 may be operated to maintain a pressure from about 25 torr to about 600 torr, preferably from about 50 torr to about 450 torr, in the tank 436.

In one embodiment, the controller 126 may be employed to control the motive fluid to the venturi vacuum generator 907 and to regulate the pressure of both the venturi vacuum generator 907 and the motive fluid. The controller 126 may be configured to communicate with the processing stations 204 and anticipate process vacuum demands in the tanks 436. In addition, the controller 126 may switch between motive fluid sources to meet the demands of the process.

Figure 17:
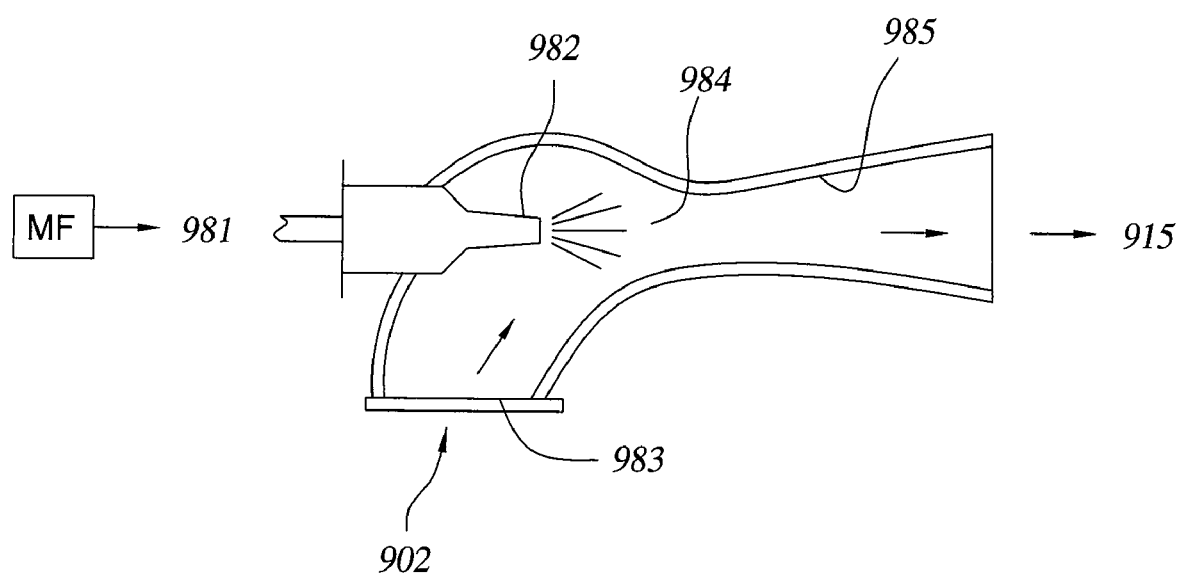
FIG. 17 shows an exemplary embodiment of a venturi vacuum pump.

Referring now to FIG. 17, one embodiment of the venturi vacuum generator 907 is shown. The venturi vacuum generator 907 includes an inlet 981 for introducing the motive fluid into the nozzle 982. A suction inlet 983 connects to the vacuum line 902 from tank 436 for fluid communication between the vacuum line 902 and the venturi vacuum generator 907. The venturi vacuum generator 907 includes a restriction located upstream from the nozzle 982. The restriction 984 causes the motive fluid velocity to increase and the pressure to decrease, thereby generating a vacuum at the restriction 984. The vacuum draws fluid from the vacuum line 902 into the venturi vacuum generator 907. The drawn fluid is mixed with the motive fluid and urged through the restriction 984. A diffuser 985 having a larger inner diameter than the restriction 984 is located upstream from the restriction 984. The diffuser 985 allows velocity of the fluids to decrease and the pressure to increase prior to leaving the venturi vacuum generator 907. The fluids are discharged into a fluid flow line 915 connected to the tank 906.

A venturi vacuum generator may be particularly desirable because it is compact and can be located near the process to provide the necessary vacuum. The size and placement offer several advantages to the manufacturing process. First, the location of venturi vacuum generator proximate the processing stations may increase the efficiency of the vacuum generator. In general, the effectiveness of the vacuum decreases as the length of the vacuum path increases. Thus, a vacuum generator locatable at a short distance from the processing stations is preferred. As shown in FIG. 16A, the venturi vacuum generator 907 is integrated with the processing tool. In this respect, the vacuum line 902 from the tank 436 to the vacuum generator 907 may be a distance from 1 in. to 4 ft., preferably, from 1 in. to 2 ft.; and more preferably, from 3 in. to 12 in. Second, the venturi vacuum generator may fit into the limited space available on the manufacturing floor by integrating into the process equipment. The venturi vacuum generator may also be integrated into the tool resulting in higher installation efficiency and repeatability of the performances in various installation designs. Third, the venturi vacuum generator typically does not have any moving parts, thereby reducing maintenance costs. Fourth, the venturi vacuum generator may be powered by any suitable compressed gas source, which is routinely found in most manufacturing environments.

Additionally, ease of operation of the venturi vacuum generator allows it to be efficiently toggled between the on and off positions, thereby conserving power when the chemical process is idle. The venturi vacuum generator is capable of generating a vacuum whenever a motive fluid is supplied. Because the venturi vacuum generator has no moving parts, it may be turned on and off simply by controlling the supply of motive fluid. For example, the chemical process may be idle during transfer of the wafer in and out of the processing station. During this idle time, the venturi vacuum generator may be turned off to conserve motive fluid. The generator may be quickly turned on when the subsequent wafer is in place for processing.

In one embodiment, the venturi vacuum pump and its associated valves and piping may be manufactured suing a highly inert polymeric material. In this respect, the polymeric material would not corrode or degrade in wet process chemical environments. These polymeric materials may be selected from high purity resins that allow the removed chemicals to remain pure and reusable.

Figure 16B:
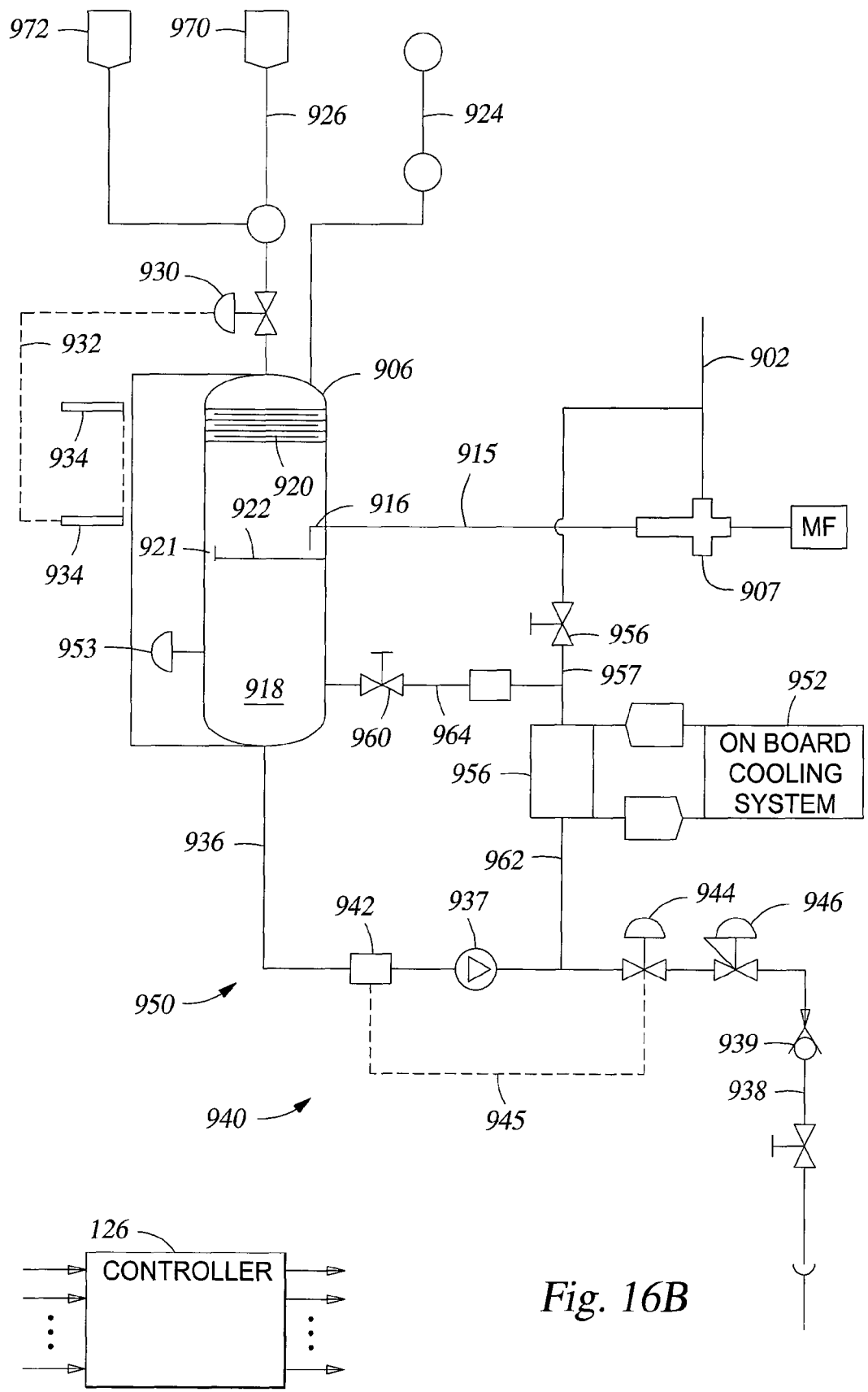
FIG. 16B is a detailed diagram of an embodiment of the collection unit of the vacuum pump system

FIG. 16B is a more detailed view of the collection unit 909 shown in FIG. 16A. The pump 907 is connected at its discharge port 946 to a fluid flow line 915 which terminates at the tank 906. In one embodiment, the tank 906 is configured to further separate liquids from gases in the incoming liquid-gas streams. To this end, the tank 906 may include an impingement plate 916 at an inlet of the tank 906. Upon encountering the impingement plate 916, liquid is condensed out of the incoming fluid streams by operation of blunt force. Also, the tank 906 may be operated at atmospheric pressure to facilitate condensation of the gases. The tank 906 may optionally include a demister 920. The demister 920 generally includes an array of surfaces positioned at angles (e.g., approximately 90 degrees) relative to the fluid being flowed through the demister 920. Impingement with the demister surfaces causes further condensation of liquid from the gas. Liquid condensed from the incoming stream is captured in a liquid storage area 918 at a lower portion of the tank 906, while any remaining vapor is removed through an exhaust line 924. In one embodiment, a degassing baffle 922 is positioned below the demister, e.g., just below the impingement plate 916. The degassing baffle 922 extends over the liquid storage area 918 and forms an opening 921 at one end. In this configuration the degassing baffle 922 allows liquid to enter the liquid storage area 918 via the opening 921, but prevents moisture from the liquid from being reintroduced with the incoming liquid-gas stream.

In one embodiment, the fluid contained in the tank 906 is heat exchanged to maintain a desired fluid temperature. For example, in one embodiment, it may be desirable to maintain the fluid at a temperature below 10° C. To this end, the vacuum pump subsystem 120 optionally includes a cooling loop 950. A pump 937 (e.g., a centrifugal pump) provides the mechanical motivation to flow the fluid through the cooling loop 950. The cooling loop 950 includes an outlet line 936 and a pair of return lines 962, 964. The first return line 962 fluidly couples the outlet line 936 to an inlet of a heat exchanger 954. The second return line 964 is coupled to an outlet of the heat exchanger 954 and terminates at the tank 906, where the cooled fluid is dispensed into the liquid storage area 918 of the tank 906. Illustratively, a valve 960 is disposed in the second return line 964, whereby the cooling loop 950 may be isolated from the tank 906. In this way, the temperature controlled fluid causes some vapor/mist to condense out of the incoming fluid.

In one embodiment, the heat exchanger 954 is in fluid communication with an onboard cooling system 952. In particular embodiment, the onboard cooling system 952 is a Freon-based cooling system, which flows Freon through the heat exchanger 954. In this context, "onboard" refers to the cooling system 953 being physically integrated with the heat exchanger 954. In another embodiment, the cooling system 953 may be an "off-board" component, such as a stand-alone chiller.

During operation, the fluid in the tank 906 may be circulated from the tank 906 through the cooling loop 950 on a continual or periodic basis. As the fluid is flowed through the heat exchanger 954, the fluid is cooled and then returned to the tank 906. The heat exchange effected by the heat exchanger 954 (i.e., the temperature to which the sealant fluid is brought) may be controlled by operating the cooling system 952. To this end, a temperature sensor 953 may be placed in communication with the fluid contained in the liquid storage area 918 of the tank 906. Measurements made by the temperature sensor 953 may be provided to the controller 126. The controller 126 may then issue appropriate control signals to the cooling system 952, thereby causing the cooling system 952 to adjust the temperature of the Freon (or other cooling fluid being used). It is also contemplated that the fluid in the liquid storage area 918 may in part be cooled by thermal exchange with the ambient environment of the tank 906. In this way, the fluid may be maintained at a desired temperature.

In one embodiment, the cooled fluid from the cooling loop 950 may optionally be injected into the vacuum line 902 upstream from the venturi vacuum generator 907. Accordingly, the vacuum pump subsystem 120 includes a feed line 957 shown branching from the second return line 964. A valve 956 is disposed in the feed line 957, whereby fluid communication between the cooling loop 950 and the vacuum line 902 may be established or disconnected. While the valve 956 remains open, a portion of the cooled fluid flows from the cooling loop 950 into the vacuum line 902, via the feed line 957. Thus, the cooled sealant fluid enters a stream of gas/liquid flowing through the vacuum line 902 towards the venturi vacuum generator 907. In this way, the relatively low temperature cooled fluid causes some vapor or mist to condense out of the incoming gas/liquid stream prior to entering the pump 914. This additional cooling step is particularly useful for processes that are exothermic and leaves the tank 436 at an elevated temperature. In one embodiment, for a temperature of the incoming stream (from the vacuum tanks via the vacuum line 902) between about 80° C. and about 10° C., the temperature of the cooled sealant fluid may be between about 5° C. and about 10° C.

In one embodiment, the vacuum pump subsystem 120 is configured to monitor one more concentrations of constituents in the fluid in the liquid storage. Monitoring chemical concentrations may be desirable, for example, to protect any (e.g., metal) components of the pump 914, and/or other components of the vacuum pump subsystem 120. To this end, the system 120 shown in FIG. 16B includes an active chemical concentration control system 940 disposed in the cooling loop 950. In the illustrative embodiment, the concentration control system 940 includes a chemical monitor 942 in electrical communication with a pneumatic valve 944, as shown by the bidirectional communication path 945. It should be appreciated, however, that the pneumatic valve 944 may not communicate directly with one another, but rather through the controller 126. During operation, the chemical monitor 942 checks the concentration of one or more constituents of the fluid flowing through the outlet line 936. If a set point of the chemical monitor 942 is exceeded, the chemical monitor 942 (or the controller 126 in response to the signal from the chemical monitor 942) issues a signal to the pneumatic valve 944, whereby the pneumatic valve 944 opens communication to a drain line 938 in order to allow at least a portion of the fluid to drain. In the illustrative embodiment, a check valve 939 is disposed in the drain line 938 to prevent backflow of fluids. Further, a back pressure regulator 946 is disposed in the drain line 938, or at a point upstream from the drain line. The back pressure regulator 946 ensures that a sufficient pressure is maintained in the cooling loop 950, thereby allowing continued flow of the fluid through the cooling loop 950.

In one embodiment, the tank 906 is selectively fluidly coupled to one of a plurality of different drains. A particular one of the plurality of drains is then selected on the basis of the make-up (i.e., constituents or concentrations) of the collected fluid. For example, in the case of a collected fluid containing a solvent the collected fluid may be directed to a first drain, while in the case of a non-solvent the collected fluid may be directed to a second drain. In at least one aspect, this embodiment may serve to avoid deposits being built up in a given drain line that might otherwise occur where, for example, solvents and non-solvents are disposed of through the same drain. Accordingly, it is contemplated that the fluid can be monitored for independent formations of chemical solution such as HF, NH3, HCL or IPA. Each of these chemical solutions can be directed to a separate drain (or, some combinations of the solutions may be directed to separate drains). In one embodiment, this can be accomplished using a sound velocity sensor to measure the changing density of the solution in the tank 906.

While the tank 906 is being drained (and, more generally, at any time during operation of the system 120), a sufficient level of fluid may be maintained in the tank 906 by provision of an active level control system 928. In one embodiment, the active level control system 928 includes a pneumatic valve 944 disposed in an input line 926, and a plurality of fluid level sensors $934_{1-2}$. The fluid level sensors may include, for example, a high level fluid sensor $934_1$ and a low level fluid sensor $934_2$. The pneumatic valve 944 and the plurality of fluid level sensors $934_{1-2}$ are in electrical communication with each other via the controller 126, as indicated by the dashed communication path 932. In operation, the fluid level in the tank 906 may fall sufficiently to trip the low fluid level sensor $934_2$. In response, the comptroller 126 issues a control signal causing the pneumatic valve 930 to open and allow communication between a first fluid source 970 (e.g., a source of deionized water (DIW)) with the tank 906 via the inlet line 926. Once the fluid in the tank 906 is returned to a level between the high and low level sensors $934_2$, the pneumatic valve 930 is closed.

In addition to maintaining a sufficient level of fluid in the tank 906 while the tank is being drained, the active level control system may also initiate a drain cycle in response to a signal from the high fluid level sensor $934_2$. In other words, should the fluid level in the tank 906 rise sufficiently high to trip the high fluid level sensor, the sensor then issues a signal to the controller 126. In response, the controller 126 issues a signal causing the pneumatic valve 944 to open and allow fluid flow to the drain line 938.

Further, it is contemplated that the tank 906 may be coupled to any number of fluids or additives. For example, in one embodiment the tank 906 is coupled to a neutralizer source 972. The neutralizer may be selected to neutralize various constituents of the incoming steam from the vacuum tanks via the vacuum line 902. In a particular embodiment, the neutralizer is acidic or basic, and is capable of neutralizing bases or acids, respectively. The neutralizer from the neutralizer source 972 may be selectively introduced to the tank 906 by coupling the source 972 to the inlet line 926 at a valve 974. The valve 974 may be configured such that one or both of the sources 970, 972 may be placed in fluid communication with the tank 906.

Figure 18:
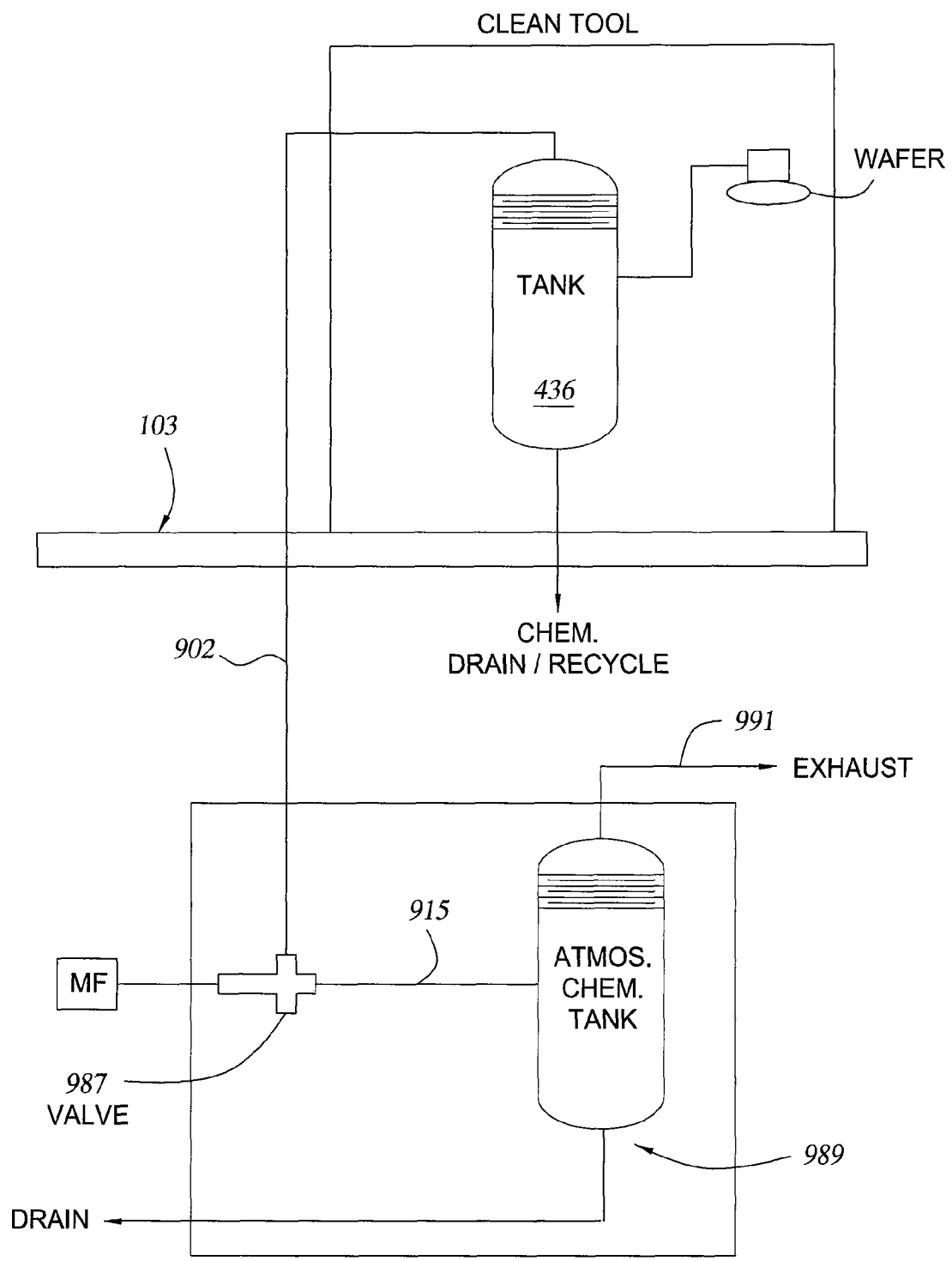
FIG. 18 is a diagram of another embodiment of a vacuum pump subsystem.

FIG. 18 illustrates another embodiment of the vacuum pump subsystem 120. The vacuum pump subsystem 120 may include a pump 987 and a fluid collection unit 989. As shown, the pump 987 and the fluid collection unit 989 are disposed outside of the clean room 103. For example, the pump 987 may be in a utility room located below clean room 103. In one embodiment, the pump 987 is a venturi vacuum generator, configured like the one shown in FIG. 17. The pump 987 is connected to the tank 436 via the vacuum line 902. In one example, the vacuum line 902 may have a length from about 15 ft. to 35 ft. The vacuum is generated by supplying a motive fluid such as compressed dry air (CDA) to the venturi vacuum generator 987. The discharged fluids from the pump 987 are introduced into the atmospheric tank 906 for separation. The separated gases are released through the exhaust 991, and the collected liquid may be drained through the outlet 992. In another embodiment, one or both of the separated gases and liquids may be reclaimed for storage or recycling to the blender 108 or other suitable input line in the processing system 100, for example, as discussed with respect to the embodiment shown in FIG. 16B.

Figure 19:
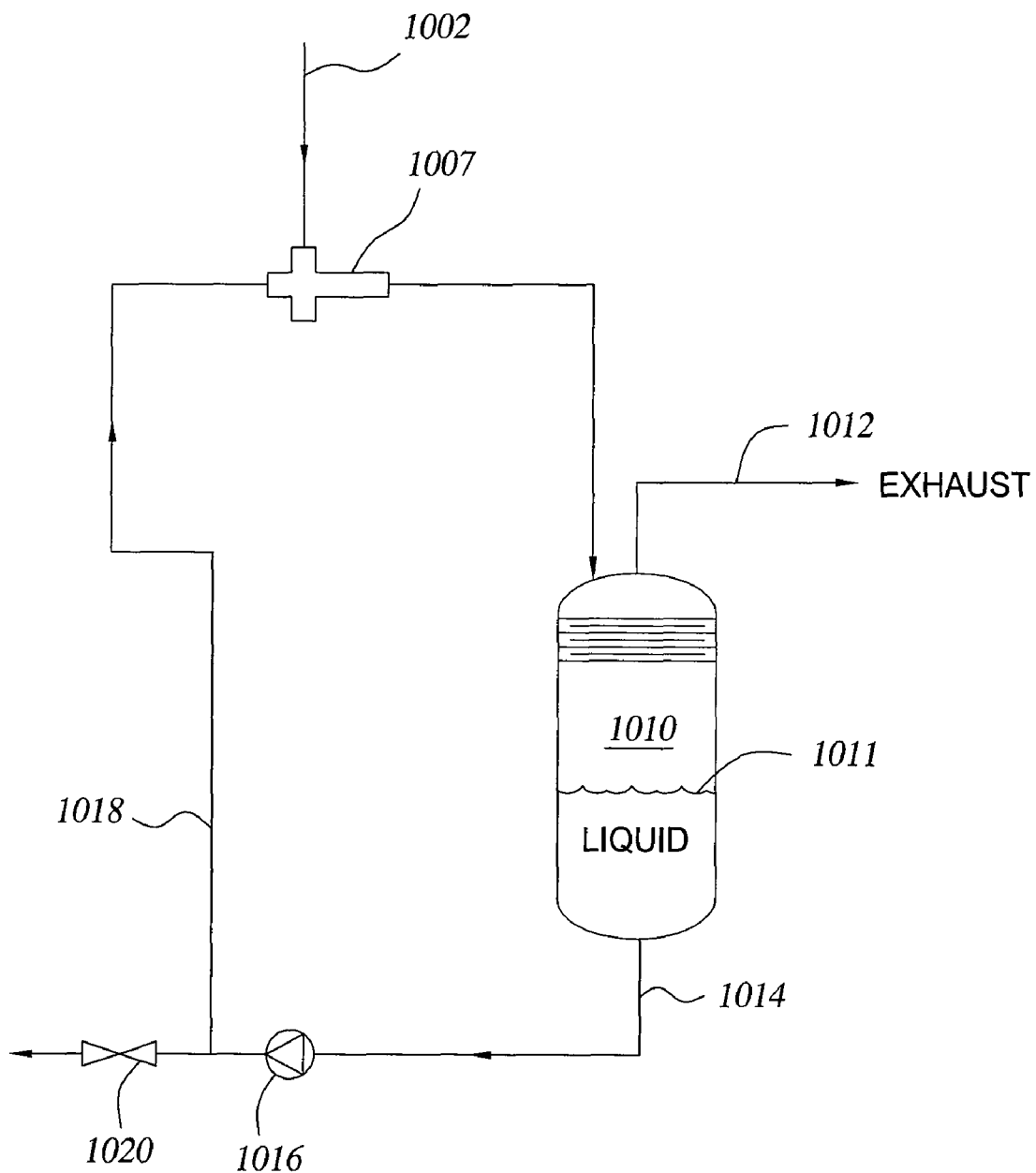
FIG. 19 is a diagram of another embodiment of a vacuum pump subsystem.

FIG. 19 illustrates another embodiment of the vacuum pump subsystem 120. The vacuum pump subsystem 120 may include a venturi vacuum generator 1007 and a fluid collection unit 1010. As shown, the pump 1007 and the fluid collection unit 1010 are disposed outside of the clean room 103. In this embodiment, the motive fluid is a liquid such as water. Water is supplied to the venturi vacuum generator 1007 to create a vacuum to draw fluid from a vacuum line 1002, which may be connected to tank 436. The fluid in the generator is directed to the collection unit 1010, where liquid is separated from gas. The separated gas is released through the exhaust 1012. The separated liquid may be discharged through outlet line 1014. In one embodiment, the frequency of discharge may be determined by the liquid level 1011. A centrifugal pump may be provided to increase the pressure of the liquid through the outlet line 1014. At least a portion of the liquid may be directed to the recycle line 1018 for use as the motive fluid to operate the venturi vacuum generator 1007. A valve 1020 positioned in the outlet line 1014 and downstream from the recycle line 1018 may be operated to drain the liquid.

Various embodiments of a chemical management system have been described herein. However, the disclosed embodiments are merely illustrative and persons skilled in the art will recognize other embodiments within the scope of the invention. For example, a number of the foregoing embodiments provide for a blender 108 which may be located onboard or off-board relative to a processing tool; however, in another embodiment, the blender 108 may be dispensed with altogether. That is, the particular solutions required for a particular process may be provided in ready to use concentrations that do not require blending. In this case, source tanks of the particular solutions may be coupled to the input flow control subsystem 112, shown in FIG. 1 for example.

Preferred processes and apparatus for practicing the present invention have been described. It will be understood and readily apparent to the skilled artisan that many changes and modifications may be made to the above-described embodiments without departing from the spirit and the scope of the present invention. The foregoing is illustrative only and that other embodiments of the integrated processes and apparatus may be employed without departing from the true scope of the invention defined in the following claims.

What is claimed is:

1. A method of controlling fluids in a processing system, comprising:
    mixing two or more chemical compounds in a blender to produce a solution;
    supplying the solution to a reclaim tank;
    dispensing the solution to a process station;
    monitoring the solution at a location between the tank and the process station to determine whether at least one of the chemical compounds is at a predetermined concentration;
    upon determining that the at least one chemical compound in the solution is at the predetermined concentration, flowing the solution to the process station;
    removing at least a portion of the solution from the process station;
    returning the removed portion of the solution to the reclaim tank;
    monitoring the removed portion of the solution at a location between the process station and the reclaim tank to determine whether at least one of the chemical compounds in the removed portion of the solution is at a predetermined concentration; and
    upon determining that the at least one chemical compound in the removed portion of the solution is at the predetermined concentration, flowing the removed portion of solution to the process station.

2. The method of claim 1, wherein upon determining that the at least one chemical compound in the removed portion of the solution is not at the predetermined concentration, draining at least a portion of the removed portion of solution and flowing the remaining portion of the removed portion of solution to the reclaim tank.

3. The method of claim 2, further comprising adjusting a concentration of the solution produced from the blender to the reclaim tank until a concentration of the solution between the reclaim tank and the process station is at the predetermined concentration.

4. The method of claim 1, wherein upon determining that the at least one chemical compound in the removed portion of the solution is not at the predetermined concentration, increasing a concentration of the solution produced from the blender to the reclaim tank until a concentration of the solution between the reclaim tank and the process station is at the predetermined concentration.

5. The method of claim 1, wherein dispensing the solution to a process station comprises dispensing the solution to at least one holding tank and dispensing the solution from the holding tank to the process station.

6. The method of claim 5, wherein the solution is dispensed to two holding tanks.

7. The method of claim 6, wherein the two holding tanks alternately fill with the solution and dispense the solution to the process station.

8. The method of claim 5, wherein the solution is monitored at a location between the at least one holding tank and the process station.

9. The method of claim 5, wherein a portion of the solution dispensed from the at least one holding tank is circulated back to the reclaim tank.

10. The method of claim 1, wherein monitoring the removed portion of the solution comprises measuring at least one characteristic of the solution.

11. The method of claim 10, wherein the at least one characteristic is selected from the group consisting of conductivity, refractive index, oxydo-reduction potential, infra-red, ultraviolet, pH, and combinations thereof.

12. The method of claim 10, further comprising determining concentration as a function of the measured characteristic.

13. A method of controlling fluids in a processing system, comprising:
mixing a solution from a supply line and a solution from a reclaim line in a reclaim tank;
dispensing the mixed solution to a process station;
measuring a characteristic of the mixed solution at a location between the tank and the process station to determine a concentration of a chemical compound of the mixed solution;
determining whether the concentration of the chemical compound is within a predetermined target concentration;
upon determining that the chemical compound in the mixed solution is at the predetermined concentration, flowing the mixed solution to the process station;
removing at least a portion of the mixed solution from the process station via the reclaim line;
measuring a characteristic of the removed portion of the mixed solution at a location in the reclaim line to determine a concentration of a chemical compound of removed portion of the mixed solution;
determining whether the concentration of the chemical compound is within a predetermined target concentration; and
upon determining that the chemical compound in the removed portion of the solution is at the predetermined concentration, flowing the removed portion of solution to the reclaim tank.

14. The method of claim 13, wherein upon determining that the at least one chemical compound in the removed portion of the mixed solution is not at the predetermined concentration, draining at least a portion of the removed portion of mixed solution and flowing the remaining portion of the removed portion of mixed solution to the reclaim tank.

15. The method of claim 14, further comprising increasing at the concentration of the solution from the supply line until a concentration of the mixed solution between the reclaim tank and the process station is at the predetermined concentration.

16. The method of claim 13, wherein dispensing the mixed solution to a process station comprises dispensing the mixed solution to at least one holding tank and dispensing the mixed solution from the holding tank to the process station.

17. The method of claim 16, wherein a portion of the mixed solution dispensed from the at least one holding tank is circulated back to the reclaim tank.

18. The method of claim 13, wherein the characteristic is selected from the group consisting of conductivity, refractive index, oxydo-reduction potential, infra-red, ultraviolet, pH, and combinations thereof.

* * * * *

UNITED STATES PATENT AND TRADEMARK OFFICE
CERTIFICATE OF CORRECTION

| | | |
|---|---|---|
| PATENT NO. | : 8,235,580 B2 | |
| APPLICATION NO. | : 12/323994 | |
| DATED | : August 7, 2012 | |
| INVENTOR(S) | : N. Fanjat et al. | |

It is certified that error appears in the above-identified patent and that said Letters Patent is hereby corrected as shown below:

Title Page, Item (75) Inventors:, replace the name

"Karl J. Urquart" with the name --Karl J. Urquhart--.

Signed and Sealed this
Twenty-fifth Day of September, 2012

David J. Kappos
*Director of the United States Patent and Trademark Office*